US008871104B2

(12) United States Patent
Park et al.

(10) Patent No.: US 8,871,104 B2
(45) Date of Patent: Oct. 28, 2014

(54) METHOD OF FORMING PATTERN, RETICLE, AND COMPUTER READABLE MEDIUM FOR STORING PROGRAM FOR FORMING PATTERN

(75) Inventors: Dong-woon Park, Seoul (KR); Hyun-jong Lee, Hwaseong-si (KR); Si-young Choi, Seongnam-si (KR); Yong-kug Bae, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 265 days.

(21) Appl. No.: 13/221,606

(22) Filed: Aug. 30, 2011

(65) Prior Publication Data

US 2012/0094492 A1     Apr. 19, 2012

(30) Foreign Application Priority Data

Oct. 13, 2010     (KR) ........................ 10-2010-0099843

(51) Int. Cl.
| G06F 17/50 | (2006.01) |
| H01L 21/027 | (2006.01) |
| H01L 21/033 | (2006.01) |
| G03F 1/70 | (2012.01) |

(52) U.S. Cl.
CPC ........ *H01L 21/0337* (2013.01); *G06F 17/5081* (2013.01); *G03F 1/70* (2013.01); Y10S 438/947 (2013.01)
USPC ............... 216/41; 216/46; 438/694; 438/696; 438/947; 700/121; 716/51; 716/54; 716/55

(58) Field of Classification Search
None
See application file for complete search history.

(56) References Cited

U.S. PATENT DOCUMENTS

| 6,993,741 | B2 * | 1/2006 | Liebmann et al. | 716/52 |
| 7,368,362 | B2 * | 5/2008 | Tran et al. | 438/401 |
| 7,539,970 | B2 * | 5/2009 | Jung et al. | 716/54 |
| 7,610,574 | B2 | 10/2009 | Shin et al. | |
| 7,816,262 | B2 * | 10/2010 | Juengling | 438/669 |
| 7,926,001 | B2 * | 4/2011 | Pierrat | 716/50 |
| 7,945,869 | B2 * | 5/2011 | Haffner et al. | 716/50 |
| 8,448,120 | B2 * | 5/2013 | Huang et al. | 716/126 |
| 2004/0229135 | A1 * | 11/2004 | Wang et al. | 430/5 |
| 2008/0076034 | A1 * | 3/2008 | Anderson et al. | 430/4 |
| 2008/0189672 | A1 * | 8/2008 | Shin et al. | 716/19 |
| 2008/0299773 | A1 * | 12/2008 | Watanabe | 438/694 |
| 2009/0125688 | A1 * | 5/2009 | Jeddeloh | 711/154 |
| 2010/0183961 | A1 * | 7/2010 | Shieh et al. | 430/30 |
| 2011/0167397 | A1 * | 7/2011 | Huckabay et al. | 716/112 |
| 2011/0318927 | A1 * | 12/2011 | Li et al. | 438/692 |
| 2013/0168827 | A1 * | 7/2013 | Kodama et al. | 257/618 |

FOREIGN PATENT DOCUMENTS

JP     2007-226394     9/2007

* cited by examiner

*Primary Examiner* — Anita Alanko
(74) *Attorney, Agent, or Firm* — F. Chau & Associates, LLC

(57) ABSTRACT

A method of forming a pattern includes forming a plurality of target patterns, forming a plurality of pitch violating patterns that make contact with the plurality of target patterns and are disposed between the plurality of target patterns, classifying the plurality of pitch violating patterns into a first region and a second region adjacent to the first region, and forming an initial pattern corresponding to one of the first region and the second region.

25 Claims, 30 Drawing Sheets

METHOD OF FORMING PATTERN, RETICLE, AND COMPUTER READABLE MEDIUM FOR STORING PROGRAM FOR FORMING PATTERN

CROSS-REFERENCE TO RELATED APPLICATIONS

This application claims priority under 35 U.S.C. §119 to Korean Patent Application No. 10-2010-0099843, filed on Oct. 13, 2010, the disclosure of which is incorporated by reference herein in its entirety.

BACKGROUND

1. Technical Field

Exemplary embodiments of the inventive concept relate to a method of forming a pattern, a reticle, and a recording medium, and more particularly, to a method of forming a fine pattern of a reticle or semiconductor device, a reticle including the fine pattern that has been formed, and a recording medium including a program for forming the fine pattern.

2. Discussion of the Related Art

Double patterning is a technique for forming a pattern having a pitch less than a minimum pitch of an exposure apparatus without changing the exposure apparatus. For example, a pattern having a pitch less than the minimum pitch may be formed using a double patterning process including a first photolithography process of forming a pattern having a pitch the same as the minimum pitch, and a second photolithography process of forming an additional pattern.

SUMMARY

Exemplary embodiments of the inventive concept provide a method of forming a fine pattern using a double patterning method such that a target pattern has a pitch less than a minimum pitch of an exposure apparatus.

Exemplary embodiments of the inventive concept further provide a reticle for forming the fine pattern and a recording medium for storing a program for forming the pattern.

According to an exemplary embodiment of the inventive concept, a method of forming a pattern includes defining a plurality of target patterns, defining a plurality of pitch violating patterns that contact the plurality of target patterns and correspond to regions between the target patterns, forming an initial pattern defined by classifying the plurality of pitch violating patterns into a first region and a second region adjacent to the first region, and selecting one of the first region and the second region.

Defining the plurality of pitch violating patterns may include defining a region between the target patterns having a pitch less than a minimum pitch of an exposure apparatus as the pitch violating pattern.

Forming the initial pattern may include classifying the plurality of pitch violating patterns having a pitch less than a minimum pitch into the first region and the second region, and defining one of the first region and the second region as the initial pattern.

Classifying the plurality of pitch violating patterns into the first region and the second region may include associating the plurality of pitch violating patterns to a plurality of virtual nodes, establishing connectivity between the virtual nodes corresponding to the pitch violating patterns if a pitch between the pitch violating patterns is less than the minimum pitch, alternately assigning a first color and a second color to all of the virtual nodes based on the connectivity, classifying the pitch violating patterns corresponding to the virtual nodes having the first color into the first region, and classifying the pitch violating patterns corresponding to the virtual nodes having the second color into the second region.

The initial pattern may be defined to further include a protrusion that extends into a portion of the target pattern that does not make contact with the first region and the second region.

The protrusion may protrude from the portion of the target pattern that does not make contact with both the first region and the second region, and extend in a direction perpendicular to an extending direction of the target pattern by a minimum bar size.

The method may further include forming a side wall that surrounds the initial pattern, and forming a trimming pattern that is defined as a region of the side wall that excludes a portion where the side wall overlaps the target pattern.

The initial pattern may be formed on a first reticle, and the trimming pattern may be formed on a second reticle.

The method may further include forming a sacrificial pattern on a film to be etched using the first reticle, forming a spacer that surrounds the sacrificial pattern, removing the sacrificial pattern, partially removing the spacer using the second reticle, and etching the film to be etched using the spacer as an etch mask.

According to an exemplary embodiment of the inventive concept, a method of forming a pattern includes defining a plurality of target patterns having a pitch less than a minimum pitch of an exposure apparatus, defining a boundary region that surrounds the plurality of target patterns, defining a plurality of pitch violating patterns that make contact with the plurality of target patterns and each have a width less than a minimum pitch and correspond to regions between the plurality of target patterns and regions between the target pattern and the boundary region, forming an initial pattern defined by classifying the plurality of pitch violating patterns into a first region and a second region adjacent to the first region and selecting one of the first region and the second region, forming a side wall that surrounds the initial pattern, and forming a trimming pattern that is defined as a region of the side wall that excludes a portion where the side wall overlaps the target pattern.

The boundary region may be defined by expanding each of the target patterns by a predetermined size and summing the expanded regions. The predetermined size may be obtained by subtracting a width of the target pattern from the minimum pitch.

The method may further include defining a dummy pattern that is formed at regions where the pitch violating pattern contacts the boundary region.

The method may further include removing a dummy pattern that does not contact the initial pattern.

According to an exemplary embodiment of the inventive concept, a method of forming a pattern includes forming a sacrificial pattern using a first reticle, forming a spacer that surrounds the sacrificial pattern, removing the sacrificial pattern, and partially removing the spacer using the second reticle. The first reticle includes an initial pattern defined by classifying a plurality of pitch violating patterns into a first region and a second region adjacent to the first region and selecting one of the first region and the second region. The pitch violating patterns contact a plurality of target patterns and correspond to regions between the target patterns having a pitch less than the minimum pitch.

The second reticle may include a trimming pattern defined as a region of a side wall that excludes a portion where the side wall overlaps the target pattern. The side wall surrounds the pitch violating patterns.

According to an exemplary embodiment of the inventive concept, a reticle for forming a plurality of target patterns having a pitch less than a minimum pitch of an exposure apparatus includes an initial pattern defined by classifying a plurality of pitch violating patterns into a first region and a second region adjacent to the first region, and selecting one of the first region and the second region. The pitch violating patterns correspond to regions between a plurality of target patterns having a pitch less than the minimum pitch.

The reticle may further include a reticle including a trimming pattern that is defined as a region of a side wall that excludes a portion where the side wall overlaps the target pattern. The side wall surrounds the pitch violating patterns.

According to an exemplary embodiment of the inventive concept, a recording medium including a program for forming a pattern performs defining a plurality of target patterns, defining a plurality of pitch violating patterns that contact the plurality of target patterns and correspond to regions between the target patterns, and defining an initial pattern defined by classifying the plurality of pitch violating patterns into a first region and a second region adjacent to the first region, and selecting one of the first region and the second region.

According to an exemplary embodiment of the inventive concept, a method of foaming a pattern includes forming a plurality of pitch violating patterns that make contact with the plurality of target patterns and are disposed between the plurality of target patterns, classifying the plurality of pitch violating patterns into a first region and a second region adjacent to the first region, and forming an initial pattern corresponding to one of the first region and the second region.

According to an exemplary embodiment of the inventive concept, a method of manufacturing a semiconductor device includes forming a film on a substrate, forming a mask layer on the film, forming a first photoresist layer on the mask layer, forming a photoresist pattern corresponding to an initial pattern of a first reticle of an exposure apparatus by removing a portion of the first photoresist layer, forming a sacrificial pattern by etching the mask layer using the photoresist pattern, forming a spacer layer on the sacrificial pattern, forming a spacer that surrounds a portion of the sacrificial pattern by etching a portion of the spacer layer, and removing the sacrificial pattern.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
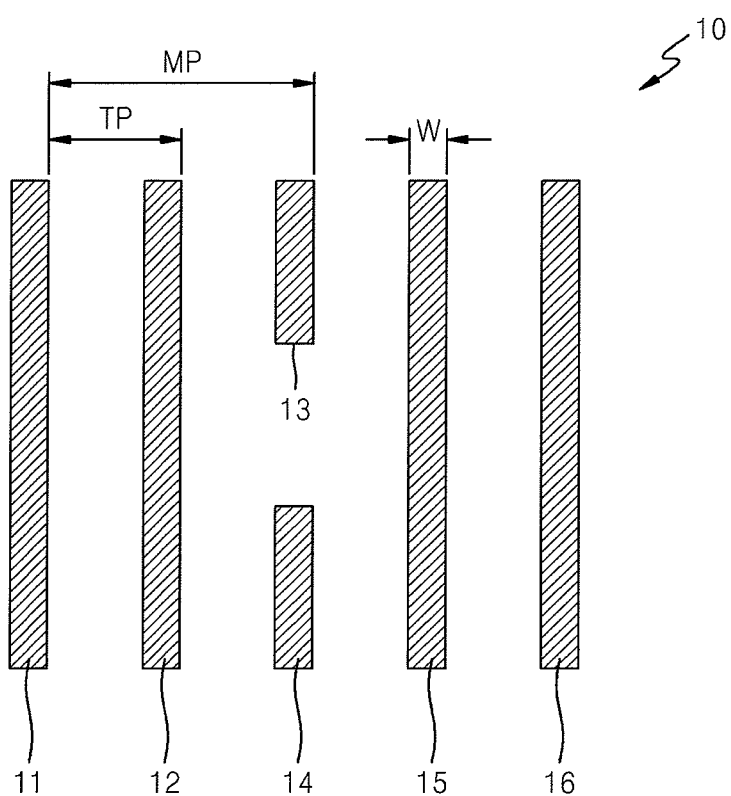
FIG. 1 is a plan view of a target pattern formed using a method of forming a pattern according to an exemplary embodiment of the inventive concept.

Exemplary embodiments of the inventive concept will be described more fully hereinafter with reference to the accompanying drawings. Like reference numerals may refer to like elements throughout the accompanying drawings.

The terms used herein are used to describe exemplary embodiments of the inventive concept. A singular form may include a plural form, unless otherwise defined. As used herein, the term "and/or" includes any one of at least one of combinations of one or more of the associated listed items.

In the present description, terms such as first, second, and the like, are used to describe various members, components, regions, layers, and/or portions. The terms are used for distinguishing one member, component, region, layer, or portion from another member, component, region, layer, or portion. Thus, a first member, region, layer, or portion which will be described may also refer to a second member, component, region, layer, or portion. Further, the term "forming" as used in the present description may refer to constructing a physical structure or defining a logical structure in a software algorithm.

FIG. 1 is a plan view of a target pattern 10 formed using a method of forming a pattern according to an exemplary embodiment of the inventive concept.

Referring to FIG. 1, the target pattern 10 has the same shape as an insulating or conductive pattern to be formed on a substrate. The target pattern 10 may include a plurality of target patterns 11 to 16, and each of the plurality of target patterns may have a pitch TP that is less than a minimum pitch MP of an exposure apparatus. W refers to the width of each of the plurality of target patterns 11 to 16.

FIGS. 2 to 12 are diagrams illustrating a method of forming a pattern according to an exemplary embodiment of the inventive concept. The method of forming the pattern according to the exemplary embodiment may be utilized to form a pattern on a reticle that is used in an exposure apparatus.

Figure 2:
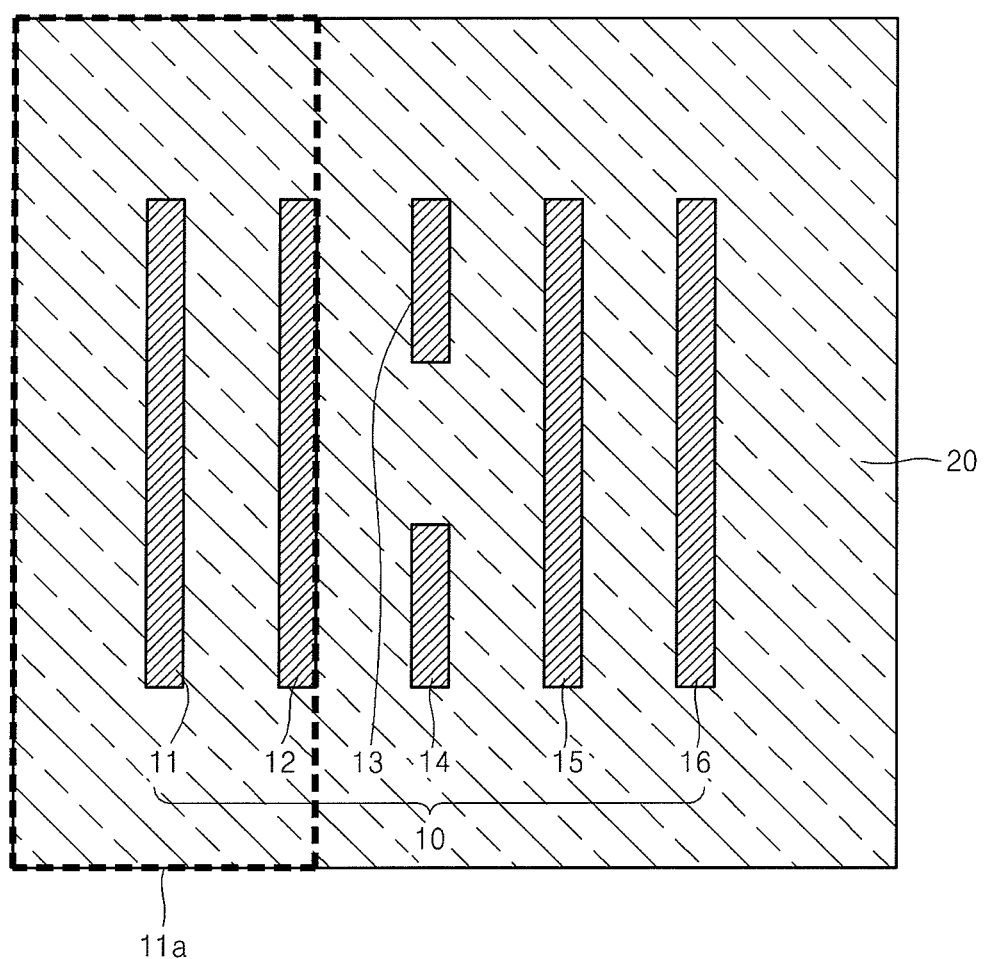
FIGS. 2 to 12 are diagrams illustrating a method of forming a pattern according to an exemplary embodiment of the inventive concept.

Referring to FIG. 2, a boundary region 20 that surrounds the target pattern 10 is defined by expanding each of the plurality of target patterns 11 to 16 by a predetermined size. For example, the predetermined size may be obtained by subtracting the width W of each of the plurality of target patterns 11 to 16 from the minimum pitch MP. For example, the boundary region 20 may be defined by defining expanded regions (for example, a region 11a) by uniformly expanding each of the plurality of target patterns 11 to 16 by a predetermined size, and adding the expanded regions together (e.g., performing an OR operation with respect to the expanded regions).

Figure 3:
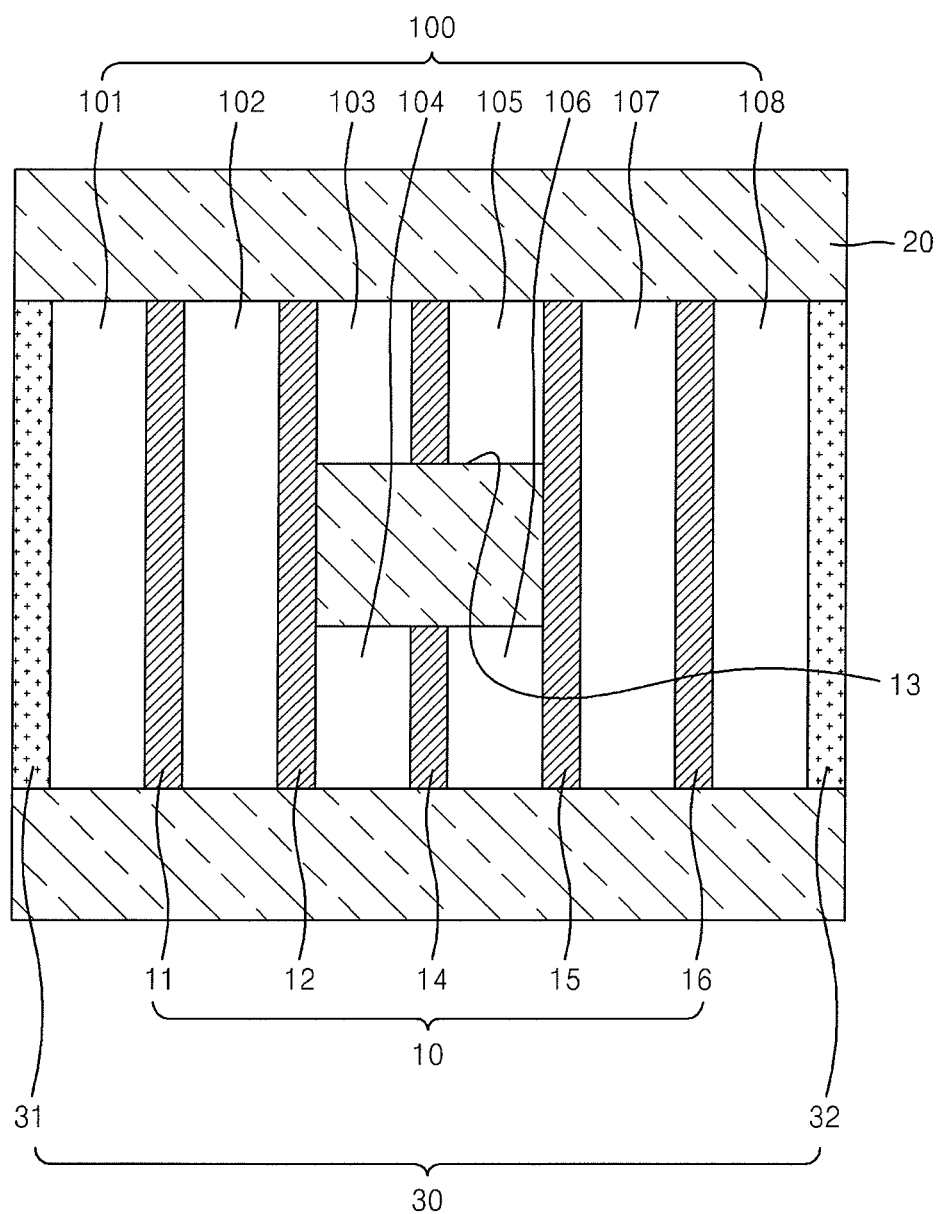

Referring to FIG. 3, a plurality of pitch violating patterns 100 are defined. The plurality of pitch violating patterns 100 may include, for example, first to eighth pitch violating patterns 101 to 108. The plurality of pitch violating patterns 100 (e.g., first to eighth pitch violating patterns 101 to 108) may include a region having a pitch less than the minimum pitch of the exposure apparatus in areas between the plurality of target patterns 11 to 16, and a region having a pitch less than the minimum pitch of the exposure apparatus in areas between the target pattern 10 and the boundary region 20. At least one surface of each of the plurality of pitch violating patterns 100 (e.g., first to eighth pitch violating patterns 101 to 108) may contact the target pattern 10.

A dummy pattern 30 is formed at portions where the plurality of pitch violating patterns 100 contact the boundary region 20. For example, in FIG. 3, a first dummy pattern 31 is formed at a portion where the first pitch violating pattern 101 contacts the boundary region 20, and a second dummy pattern 32 is formed at a portion where the eighth pitch violating pattern 108 contacts the boundary region 20.

Figure 4:
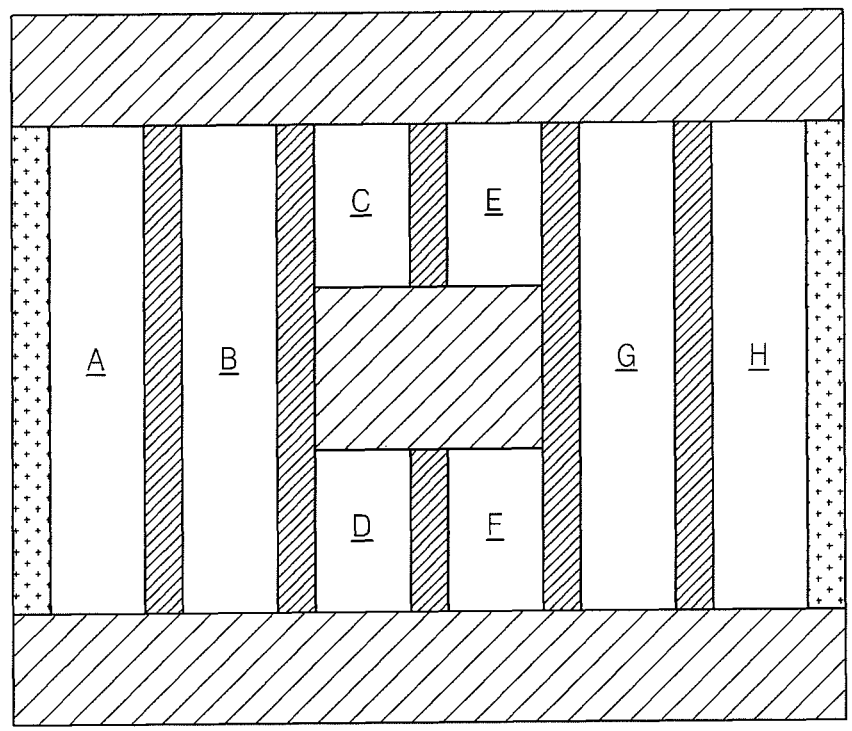

Referring to FIG. 4, the first to eighth pitch violating patterns 101 to 108 correspond to nodes (e.g., nodes A, B, C, D, E, F, G, and H). For example, the first pitch violating pattern 101 corresponds to node A, and the second to eighth pitch violating patterns 102 to 108 correspond to nodes B to H, respectively.

Figure 5:
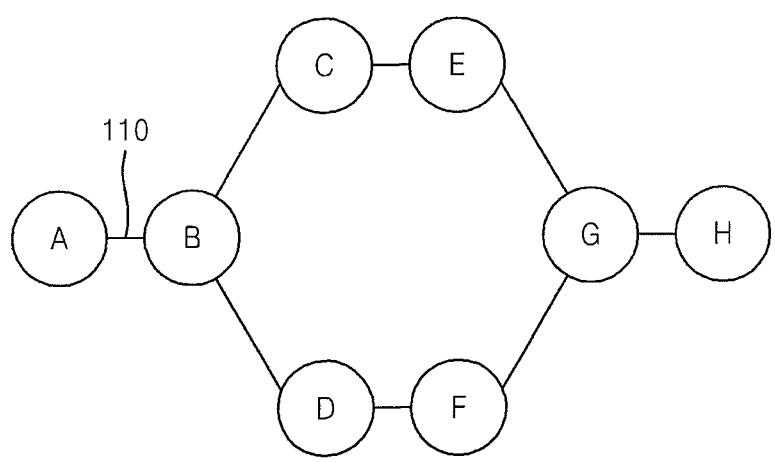

Referring to FIG. 5, if the interval between any of the first to eighth pitch violating patterns 101 to 108 is less than the minimum pitch of the exposure apparatus, connectivity is established in nodes corresponding thereto. For example, since the interval between the first pitch violating pattern 101 corresponding to node A and the second pitch violating pattern 102 corresponding to node B is less than the minimum pitch MP, connectivity 110 is established between nodes A and B. Further, since the interval between the first pitch violating pattern 101 and each of the third pitch violating pattern 103 to the eighth pitch violating pattern 108 is greater than the minimum pitch MP, connectivity is not established between node A and nodes C through H, respectively.

Figure 6:
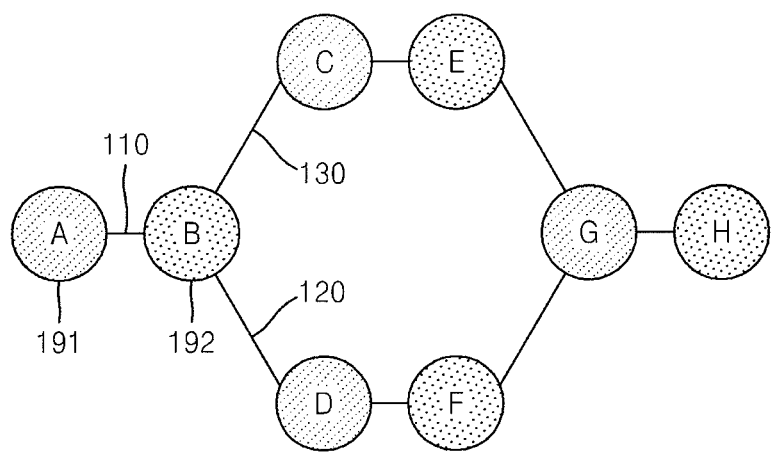

Referring to FIG. 6, a first color 191 and a second color 192 are alternately assigned to nodes A through H based on the respective connectivity of the nodes. For example, if the first color 191 is assigned to node A, the second color 192 is assigned to node B since connectivity 110 is established between nodes A and B. Since the second color 192 is assigned to node B, and since connectivity 120, 130 is established between nodes B and C and nodes B and D, respectively, the first color 191 is assigned to nodes C and D.

The operation of alternately assigning two colors to nodes A through H based on connectivity of the nodes may be performed using, for example, a graph coloring algorithm or a 2-coloring algorithm. For example, referring to FIG. 6, the first color 191 may be assigned to nodes A, C, D, and G, and the second color 192 may be assigned to nodes B, E, F, and H.

Figure 7:
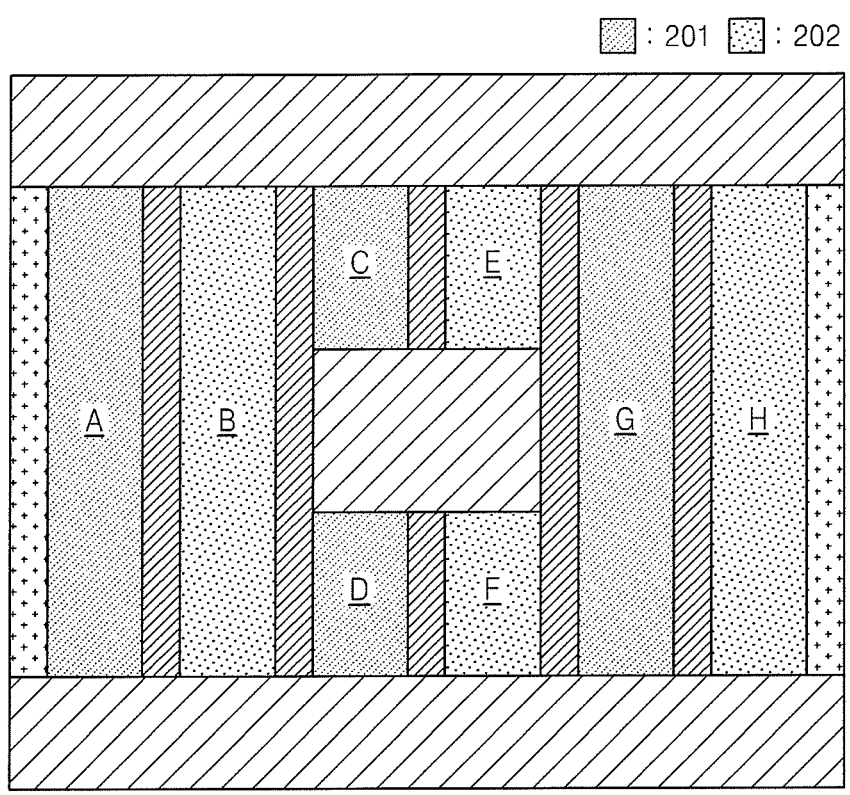

Referring to FIG. 7, the first to eighth pitch violating patterns 101 to 108 may be classified as a first region 201 and a second region 202. For example, the pitch violating patterns corresponding to the nodes having the first color 191 among nodes A through H are regarded as the first region 201, and the pitch violating patterns corresponding to the nodes having the second color 192 among nodes A through H are regarded as the second region 202.

For example, referring to FIGS. 3 and 7, the first, third, fourth, and seventh pitch violating patterns 101, 103, 104, and 107 corresponding to nodes A, C, D, and G to which the first color 191 is assigned are regarded as the first region 201, and the second, fifth, sixth, and eighth pitch violating patterns 102, 105, 106, and 108 corresponding to nodes B, E, F, and H to which the second color 192 is assigned are regarded as the second region 202.

Figure 8:
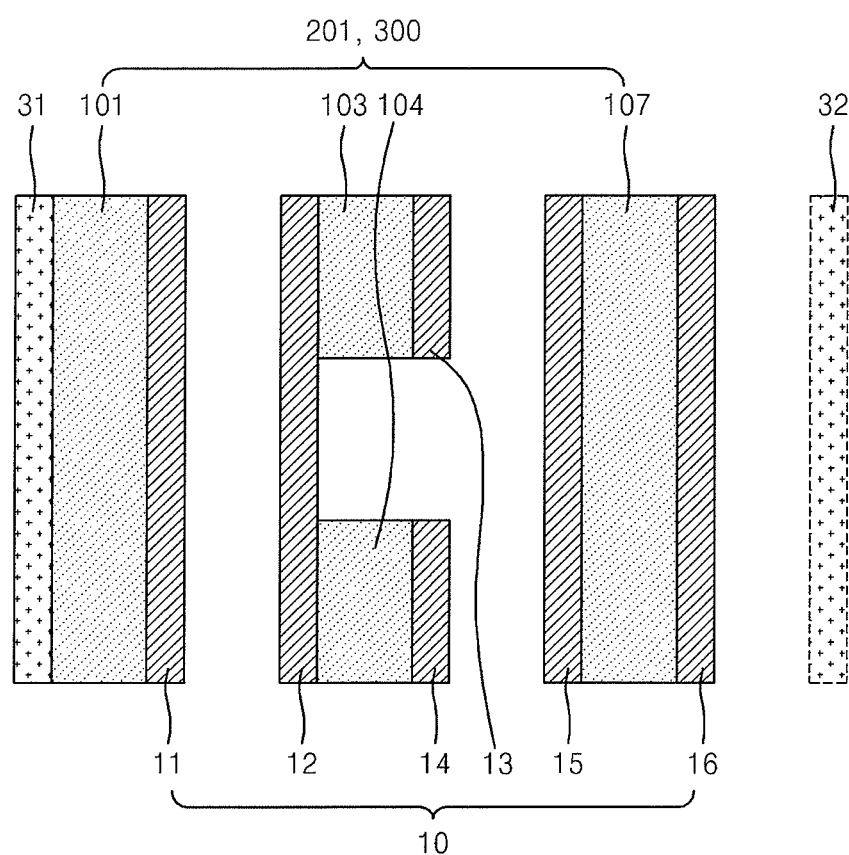

Referring to FIG. 8, one of the first region 201 and the second region 202 is defined as an initial pattern. A portion of the dummy pattern 30 (e.g., first dummy pattern 31 or second dummy pattern 32) that does not contact the initial pattern is removed from the dummy pattern 30. For example, the first, third, fourth, and seventh pitch violating patterns 101, 103, 104, and 107 corresponding to the first region 201 may be defined as an initial pattern 300, and the second dummy pattern 32 of the dummy pattern 30, which does not contact the initial pattern 300, may be removed.

Figure 9A:
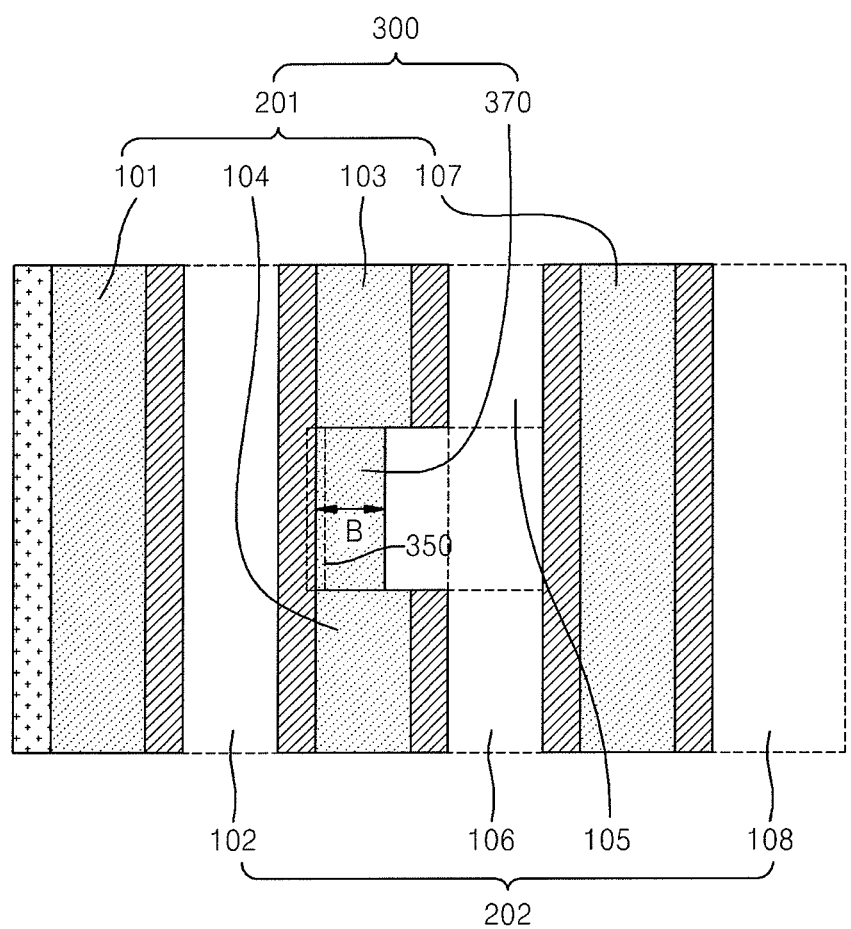

Referring to FIG. 9A, the initial pattern 300 may further include a protrusion 370 that protrudes from a portion 350 of the target pattern 10 that does not contact both of the first region 201 and the second region 202. The protrusion 370 protrudes from the portion 350 of the target pattern 10 in a direction substantially perpendicular to an extending direction of the target pattern 10 by a minimum bar size B.

The minimum bar size B indicates a minimum width of a pattern that is to be exposed to light having a wavelength used for the exposure. The minimum bar size B may be determined by the type of light used during the exposure process and the type of photoresist layer used to form the pattern. For example, the minimum bar size B may be about ¼ to about ⅔ of the minimum pitch MP of the exposure apparatus.

For example, the portion 350 of the target pattern 10 contacts both the third pitch violating region 103 and the fourth pitch violating region 104, which belong to the first region 201, and does not contact the second pitch violating region 102, which belongs to the second region 202. The initial pattern 300 may further include the protrusion 370 protruding from the portion 350 of the target pattern 10 in a direction substantially perpendicular to the extending direction of the target pattern 10 by the minimum bar size B.

Figure 9B:
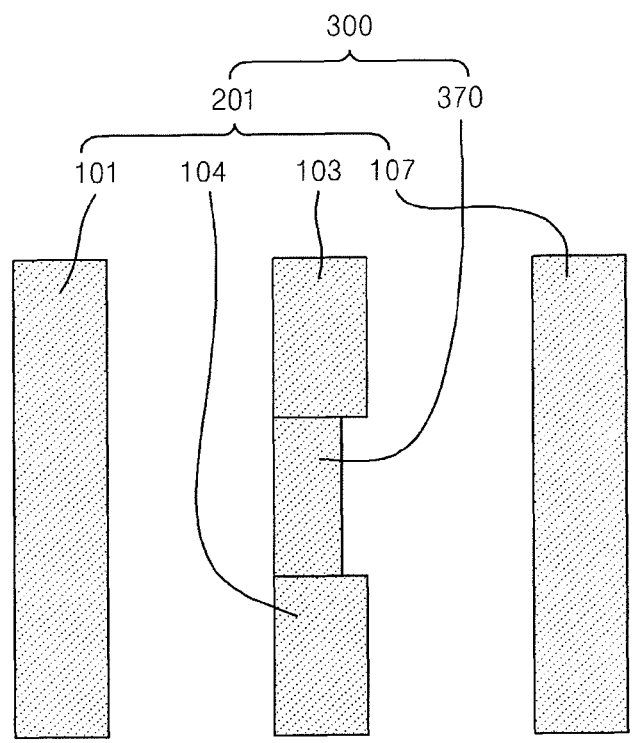

FIG. 9B illustrates the initial pattern 300 including the first region 201 and the protrusion 370. The initial pattern 300 may be used in a reticle for forming a sacrificial pattern on a film to be etched, as described below. For example, the sacrificial pattern corresponding to the initial pattern 300 may be formed on the film to be etched by an exposure process using the initial pattern 300 used in a reticle, and then a self-aligned double patterning process may be applied to the sacrificial pattern.

Figure 9C:
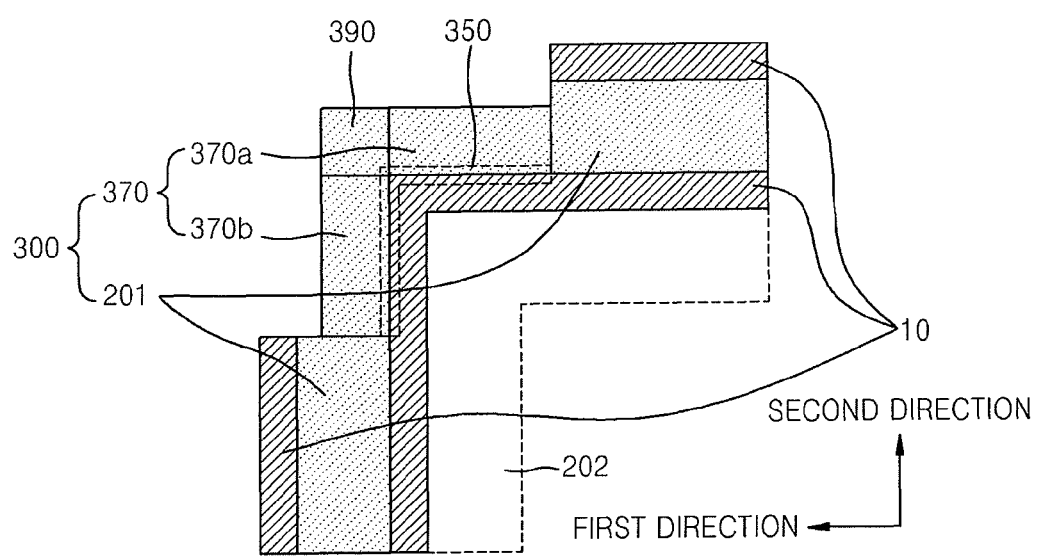

Referring to FIG. 9C, in an exemplary embodiment, the protrusion 370 may include a first protrusion 370a and a second protrusion 370b, and the initial pattern 300 may further include a corner 390 that fills a space between the first protrusion 370a and the second protrusion 370b. The first and second protrusions 370a and 370b protrude from the portion 350 of the target pattern 10 in directions substantially perpendicular to the extending direction of the target pattern 10.

The corner 390 may be formed when the target pattern 10 extends in at least two directions. For example, if the target pattern 10 extends in a first direction and a second direction perpendicular to the first direction, as shown in FIG. 9C, the first protrusion 370a may protrude in the second direction by the minimum bar size B, and the second protrusion 370b may protrude in the first direction perpendicular to the second direction by the minimum bar size B. In order to connect the first protrusion 370a to the second protrusion 370b, the initial pattern 300 may include the corner 390 to fill a space between the first protrusion 370a and the second protrusion 370b.

As described above, the initial pattern 300 may include one of the first region 201 (e.g., as shown in FIG. 9C) and the second region 202, the protrusion 370, and the corner 390.

The initial pattern 300 may be implemented, for example, as a first reticle. The first reticle including the initial pattern 300 may be used in an exposure process including a double patterning process to pattern a film to be etched. In this case, a sacrificial pattern may be formed on the film to be etched, as described with reference to FIG. 13.

Figure 10:
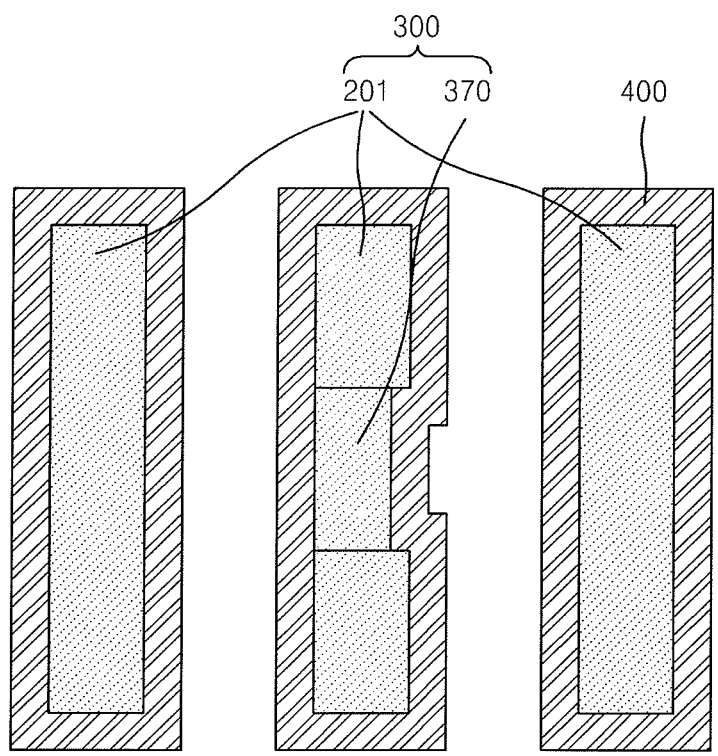
Figure 30:
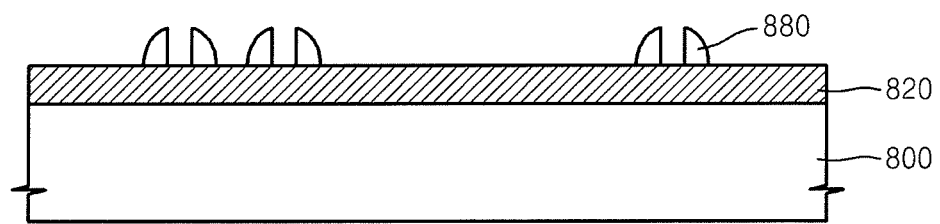

Referring to FIG. 10, a side wall 400 that surrounds the initial pattern 300 is formed. The side wall 400 corresponds to a spacer 880 (as shown in FIG. 30) formed on a film to be etched 820 (as shown in FIG. 30), and the spacer 880 may serve as an etch mask for etching the film to be etched 820 during a double patterning process, as described with reference to FIG. 30.

Figure 11:
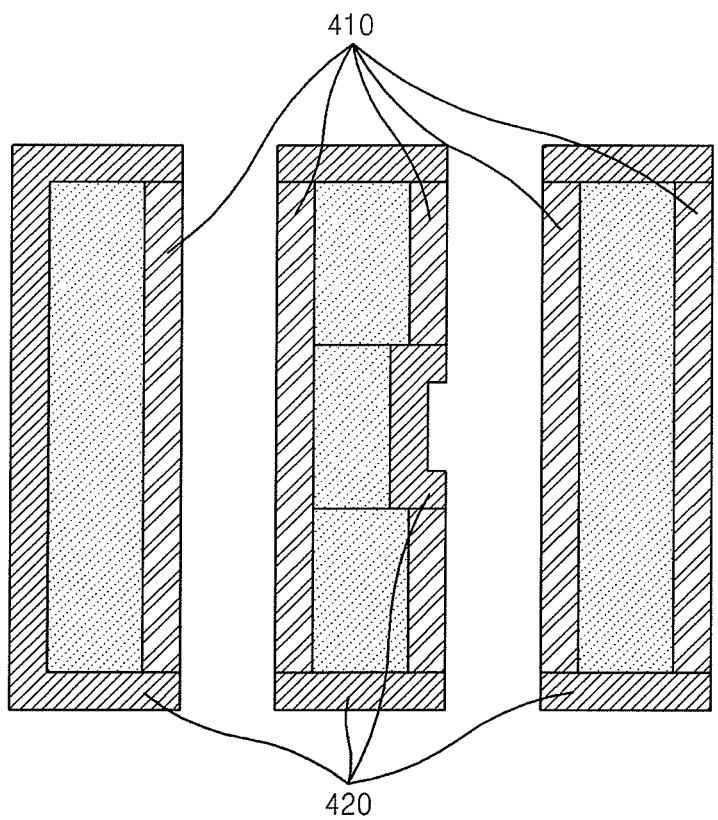

Referring to FIG. 11, a first portion 410 of the side wall 400 overlapping with the target pattern 10 is distinguished from a second portion 420 of the side wall 400 that does not overlap with the target pattern 10. The second portion 420 is used for forming a trimming pattern. As described above, the side wall 400 corresponds to the spacer 880, which acts as an etch mask for etching the film to be etched 820. Accordingly, the spacer has a shape corresponding to the target pattern 10, and thus, a portion of the spacer 880 that does not overlap with the target pattern 10 is removed.

In order to remove the portion of the spacer 880 that does not overlap with the target pattern 10, a second reticle including a trimming pattern 430 may be prepared. The trimming pattern 430 corresponds to the second portion 420 of the side wall 400. An etch mask for etching the film to be etched 820 may be prepared by removing the portion of the spacer 880 that does not overlap with the target pattern 10 by an exposure process using the second reticle.

Figure 12:
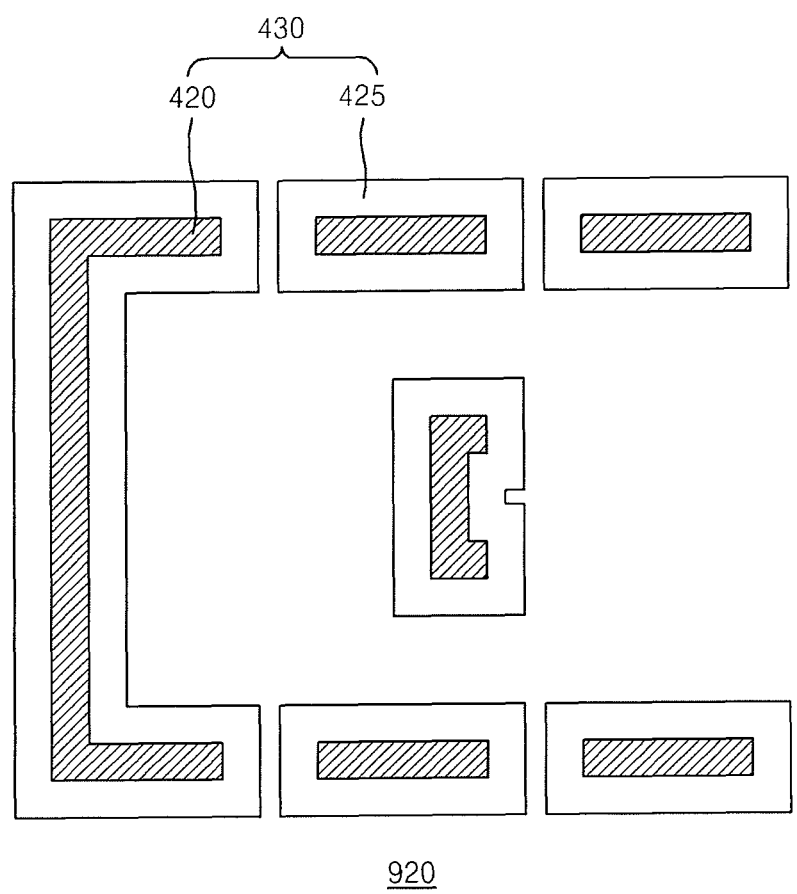

FIG. 12 illustrates the trimming pattern 430 of a second reticle 920 used for an exposure process. The trimming pattern 430 includes the second portion 420 of the side wall 400.

In an exemplary embodiment, the trimming pattern 430 of the second reticle 920 further includes a correction unit 425, which increases an overlay margin of the trimming pattern 430 and may improve patterning performance. The correction unit 425 may be formed using, for example, a design rule check (DRC) or optical proximity correction (OPC) technique.

According to the method of forming a pattern described above with reference to FIGS. 2 to 12, the initial pattern 300 and the trimming pattern 430 may be formed. A double patterning process may be performed using the initial pattern 300 and the trimming pattern 430. For example, the initial pattern 300 and the trimming pattern 430 may be respectively formed on reticles formed in an exposure apparatus, and a fine pattern may be formed on a semiconductor substrate using the reticles. This is further described with reference FIG. 13.

A double patterning process may be applied to a flash cell having a simple pattern in which, for example, patterns of a line and space shape are repeated, since a space may be decomposed by manually forming a trimming pattern. However, it may be difficult to apply a double patterning process to a complicated pattern such as, for example, a circuit pattern of a peripheral region in which discrete or bent lines are formed, since such a manual decomposition may not be possible. However, according to exemplary embodiments of the inventive concept, the trimming pattern 430 may be automatically formed when forming a pattern. Thus, since an automatic decomposition may be performed using the trimming pattern 430, the double patterning process may be applied to a circuit pattern in which discrete or bent lines are formed.

As will be appreciated by one of ordinary skill in the art, the method of forming a pattern according to the inventive concept is not limited to a fine pattern having a line width less than about 40 nm. For example, the method of forming a pattern according to the inventive concept may be applied to a pattern having a line width greater than about 40 nm.

The method of forming a pattern described above with reference to FIGS. 2 to 12 may be embodied as computer readable code on a computer readable medium. For example, a pattern-forming program for determining the shapes of patterns may be stored in a computer readable medium in a device for forming the patterns in a reticle. The pattern-forming program may automatically form the shapes of the initial pattern 300 and the trimming pattern 430 for forming the target pattern 10 according to the method of forming a pattern described above with reference to FIGS. 2 to 12.

The computer readable medium is any data storage device that can store data that can thereafter be read by a computer system. For example, the computer readable medium may be read-only memory (ROM), random-access memory (RAM), a CD-ROM, a magnetic tape, a floppy disk, an optical data storage device, or transmission media such as, for example, Internet transmission media. The computer readable medium can also be distributed over computer systems coupled via a network so that the computer readable code may be stored and executed in a distributed fashion. Functional programs, codes, and code segments can be used to implement the inventive concept.

Figure 13:
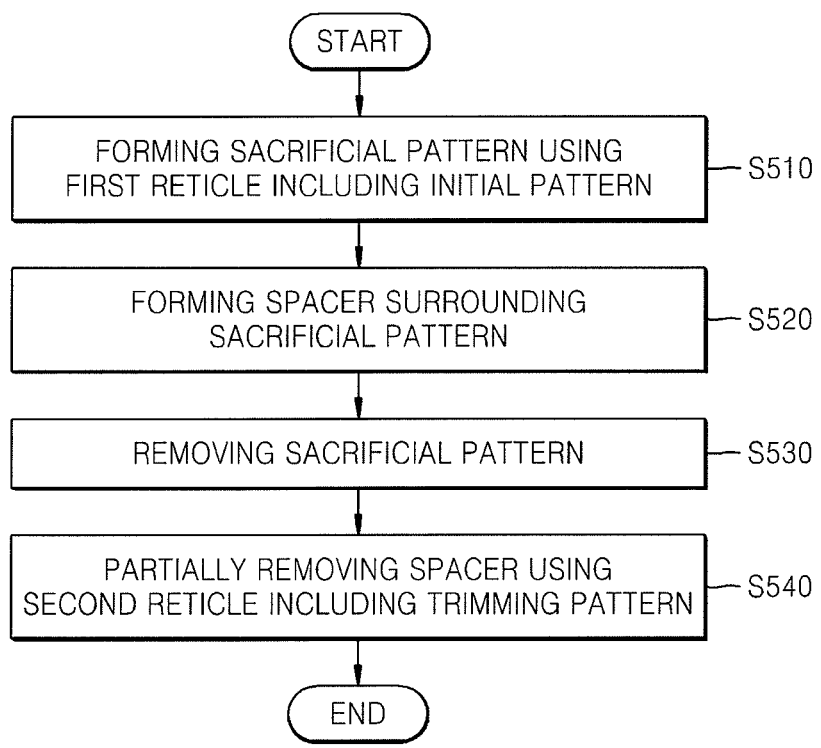
FIG. 13 is a flowchart illustrating a method of forming a pattern according to an exemplary embodiment of the inventive concept.

FIG. 13 is a flowchart illustrating a method of forming a pattern according to an exemplary embodiment of the inventive concept. The method illustrated in FIG. 13 may correspond to the method shown in FIGS. 2 to 12 (e.g., a method of forming a fine pattern on a semiconductor substrate using an initial pattern and a trimming pattern).

Referring to FIG. 13, a sacrificial pattern is formed on a film to be etched using a first reticle including an initial pattern (S510). The film to be etched may include, for example, a metal, a non-metal, or a semiconductor material.

A spacer that surrounds the sacrificial pattern is then formed (S520). The spacer may be formed, for example, by forming a spacer layer on the sacrificial pattern, and etching the spacer layer. Thus, the spacer is a portion of the spacer layer remaining after the etching. After forming the spacer, the sacrificial pattern is removed (S530).

A portion of the spacer that does not overlap with a target pattern is then removed using a second reticle including a trimming pattern (S540). The remaining portion of the spacer is used as an etch mask to etch the film to be etched. A fine pattern having the same shape as the target pattern is thereby formed.

Figure 14:
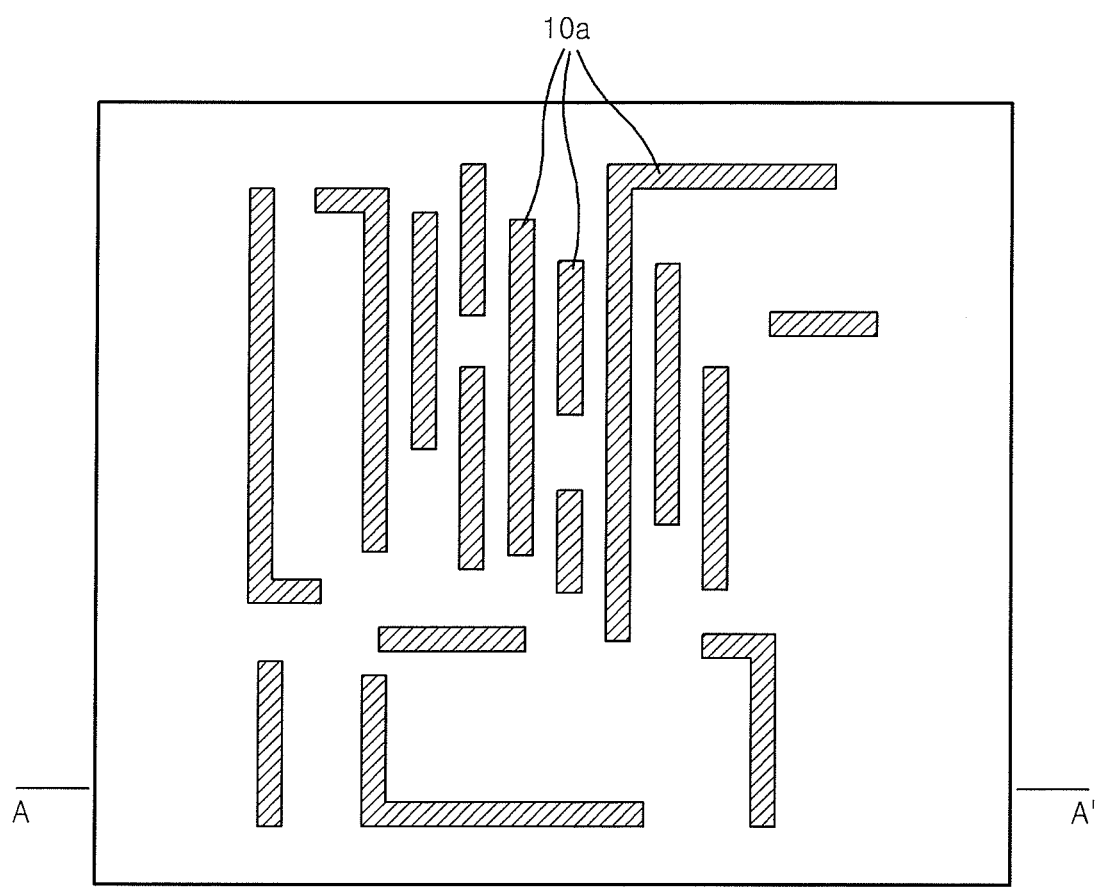
FIG. 14 is a plan view of a target pattern formed using a method of forming a pattern according to an exemplary embodiment of the inventive concept.

FIG. 14 is a plan view of a target pattern 10a formed using a method of forming a pattern according to an exemplary embodiment of the inventive concept. FIGS. 15 to 24 are diagrams illustrating a method of forming a pattern according to an exemplary embodiment of the inventive concept.

Figure 15:
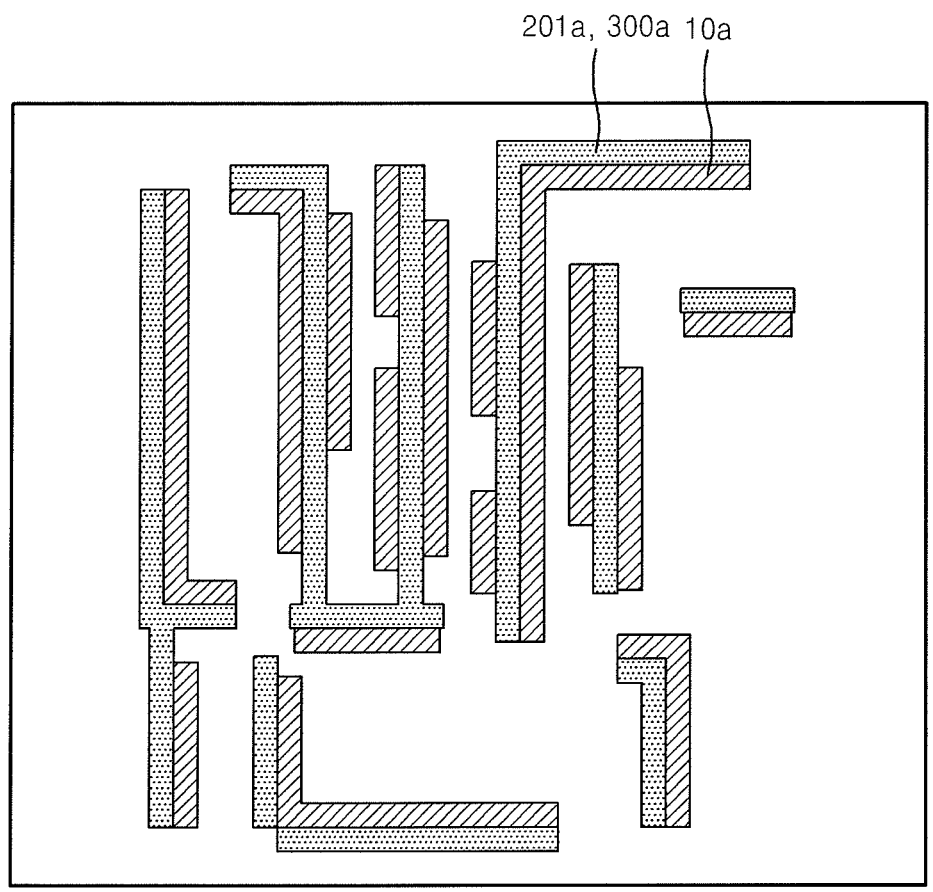
FIGS. 15 to 24 are diagrams illustrating a method of forming a pattern according to an exemplary embodiment of the inventive concept.
Figure 16:
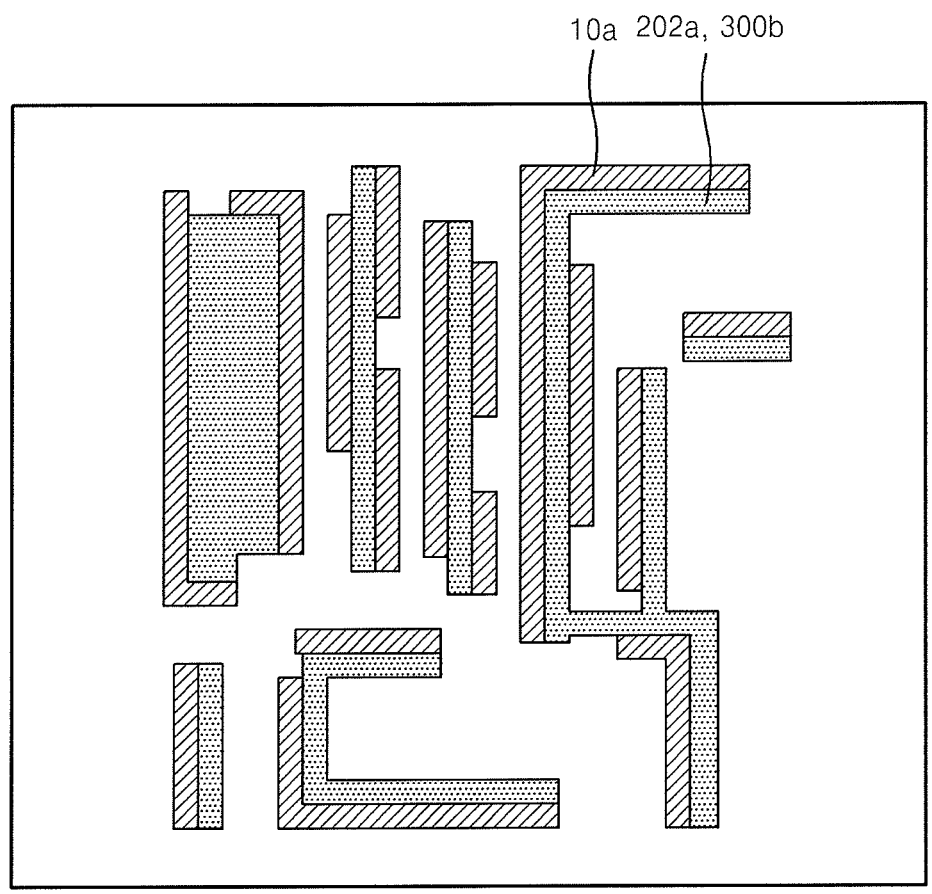

Referring to FIGS. 14 to 16, a pitch violating pattern that contacts the target pattern 10a and corresponds to a region between parts of the target pattern 10a is defined. The pitch violating pattern is classified into a first region 201a and a second region 202a, and one of the first region 201 a and the second region 202a is selected to define an initial pattern. For example, in FIG. 15, the first region 201a is defined as an initial pattern 300a, and in FIG. 16, the second region 202a is defined as an initial pattern 300b.

Figure 17:
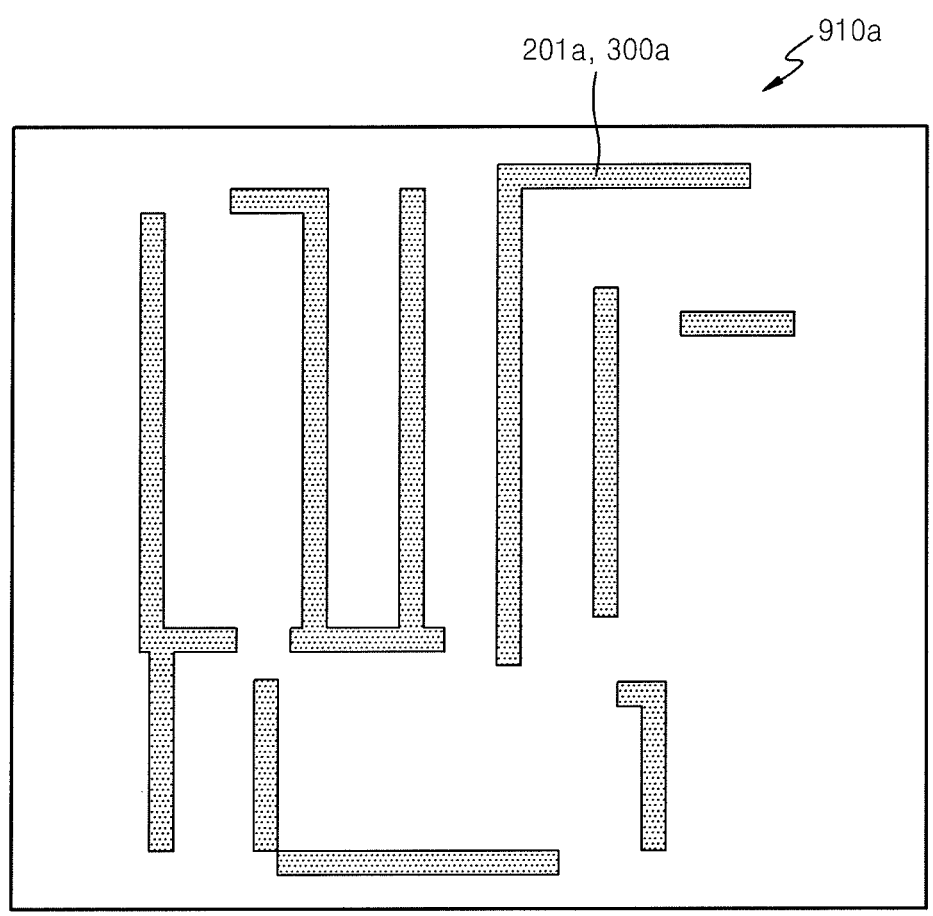
Figure 18:
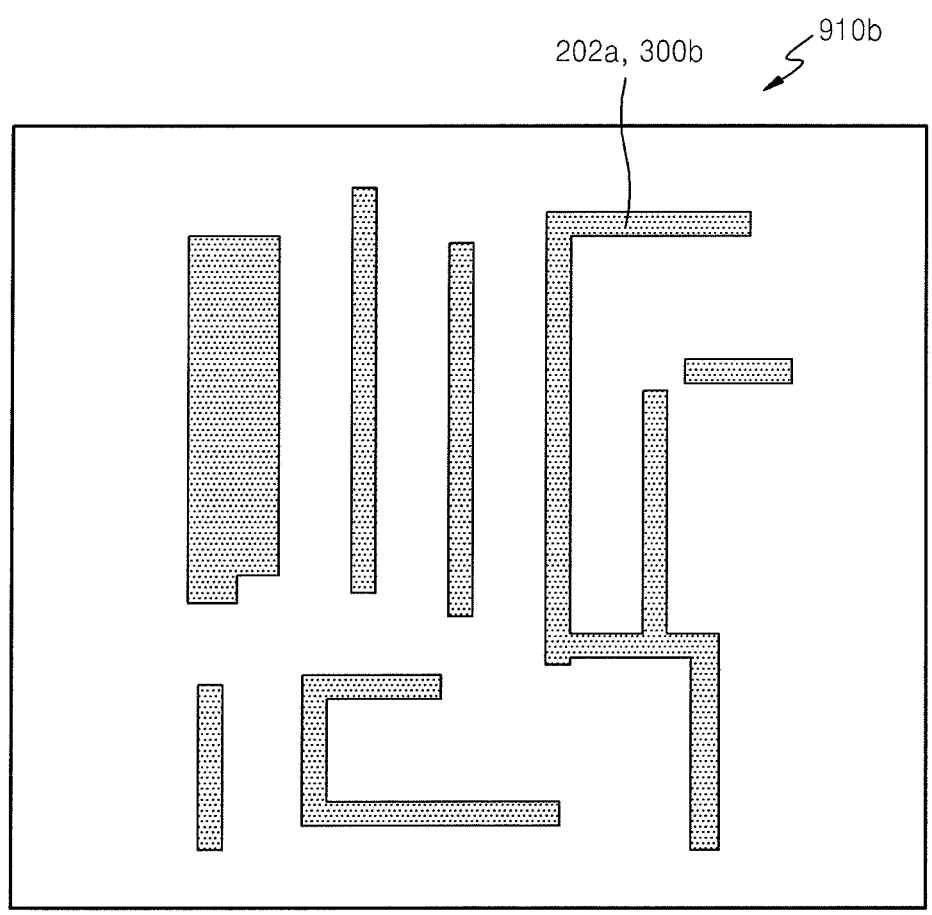

FIGS. 17 and 18 each show an initial pattern in which the target pattern 10a is removed. For example, FIG. 17 shows the initial pattern 300a corresponding to the first region 201a of the pitch violating pattern, and FIG. 18 shows the initial pattern 300b corresponding to the second region 202a of the pitch violating pattern. As described above, the initial pattern 300a or 300b may be formed on the first reticle (e.g., 910a of FIG. 26 or 910b of FIG. 37) used during the exposure process for double patterning the film to be etched, and may be used to form the sacrificial pattern on the film to be etched.

Figure 19:
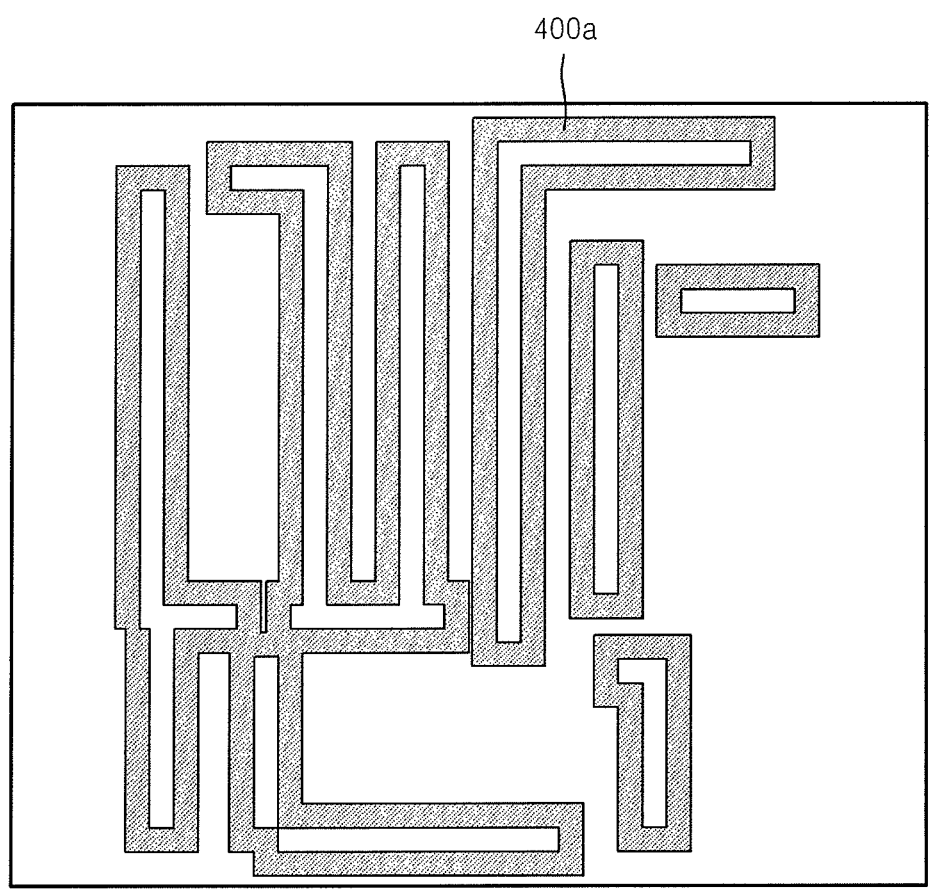
Figure 20:
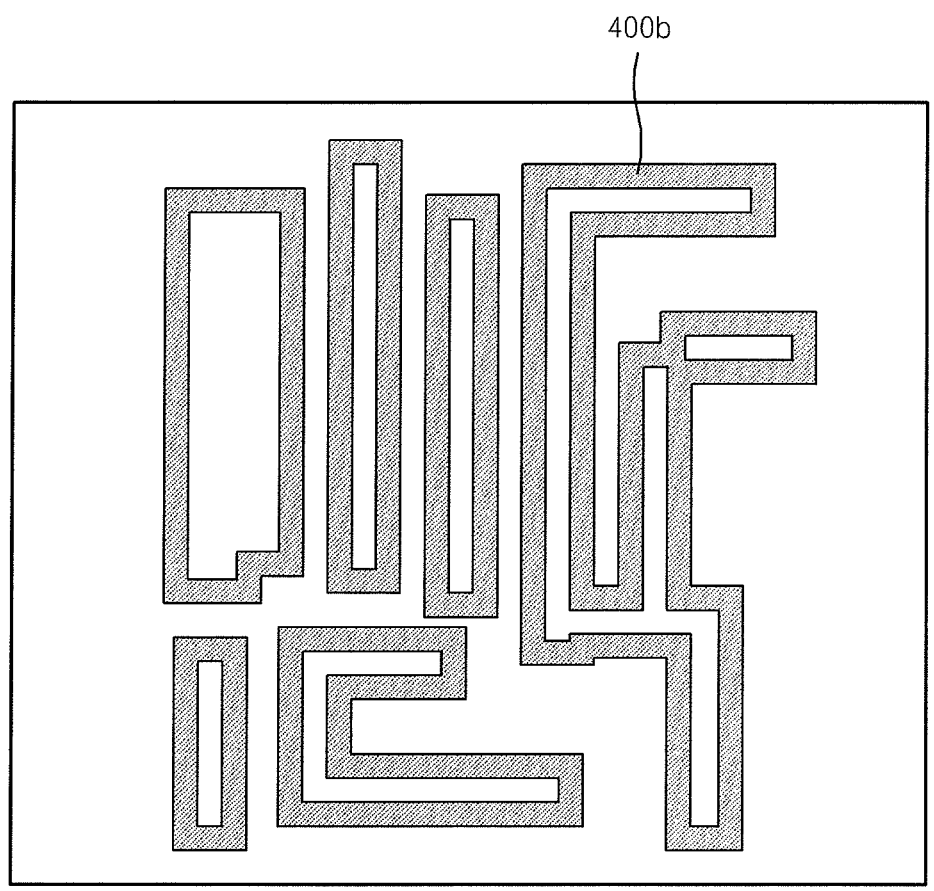

FIGS. 19 and 20 illustrate side walls 400a and 400b that surround the initial patterns (e.g., 300a, 300b). For example, FIG. 19 shows the side wall 400a, which surrounds the initial pattern 300a (as shown in FIG. 17) corresponding to the first region 201a as shown in FIG. 17, and FIG. 20 shows the side wall 400b, which surrounds the initial pattern 300b (as shown in FIG. 18) corresponding to the second region 202a (as shown in FIG. 18).

Figure 21:
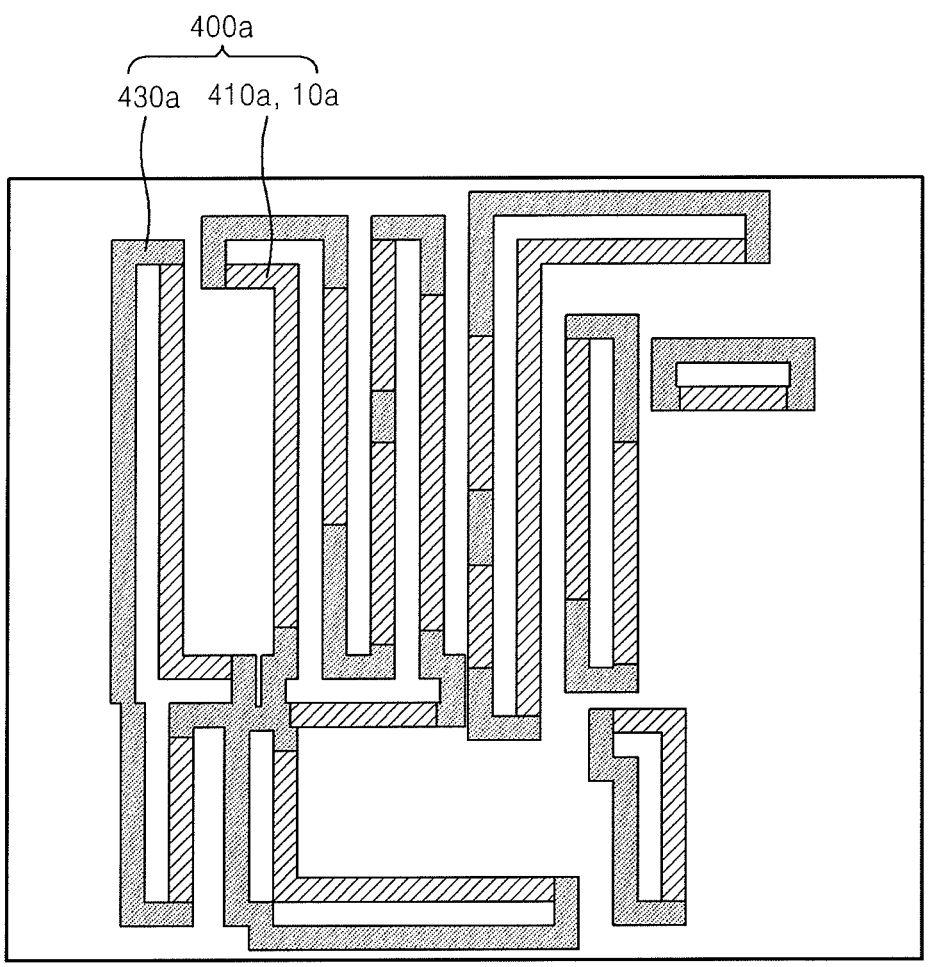
Figure 22:
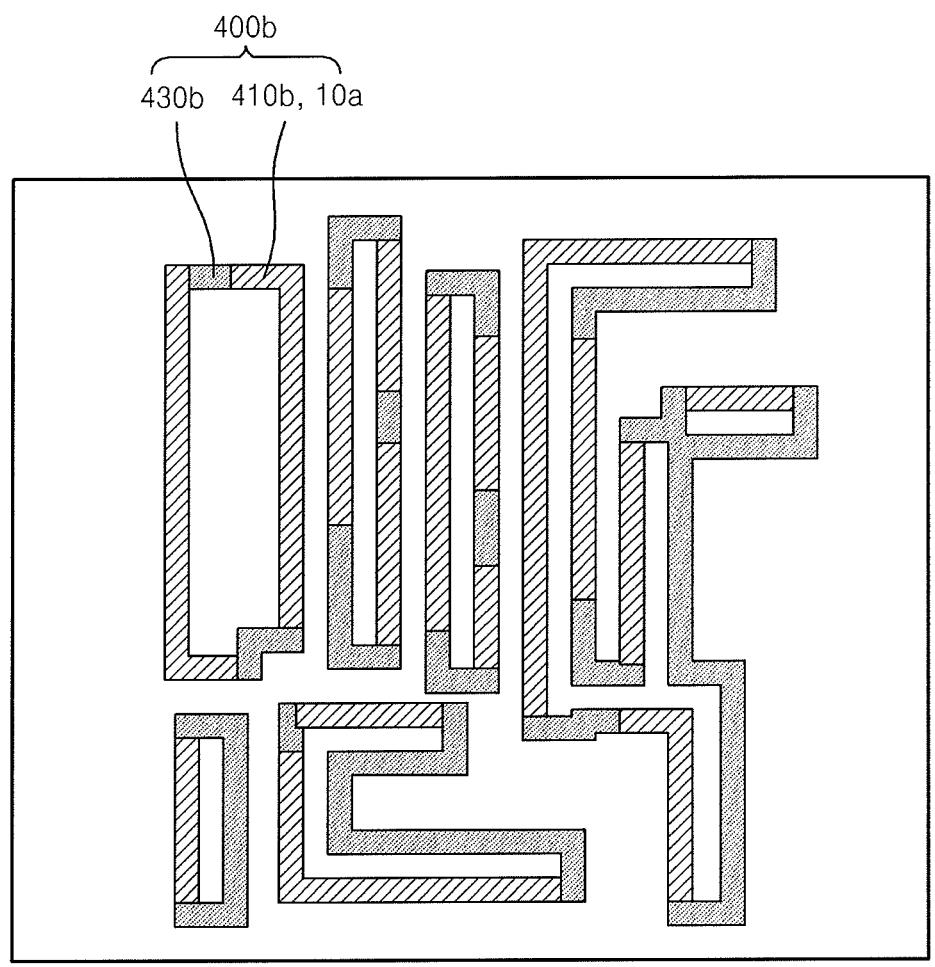

Referring to FIGS. 21 and 22, the side walls 400a and 400b overlap with the target pattern 10a, and are used for defining trimming patterns 430a and 430b. As described above, the trimming patterns 430a and 430b are defined as portions of the side walls 400a and 400b that do not overlap with the target pattern 10a. For example, referring to FIG. 21, the trimming pattern 430a is defined by removing the portions where the side wall 400a overlaps with the target pattern 10a from the side wall 400a. Referring to FIG. 22, the trimming pattern 430b is defined by removing the portions where the side wall 400b overlaps with the target pattern 10a from the side wall 400b.

Figure 23:
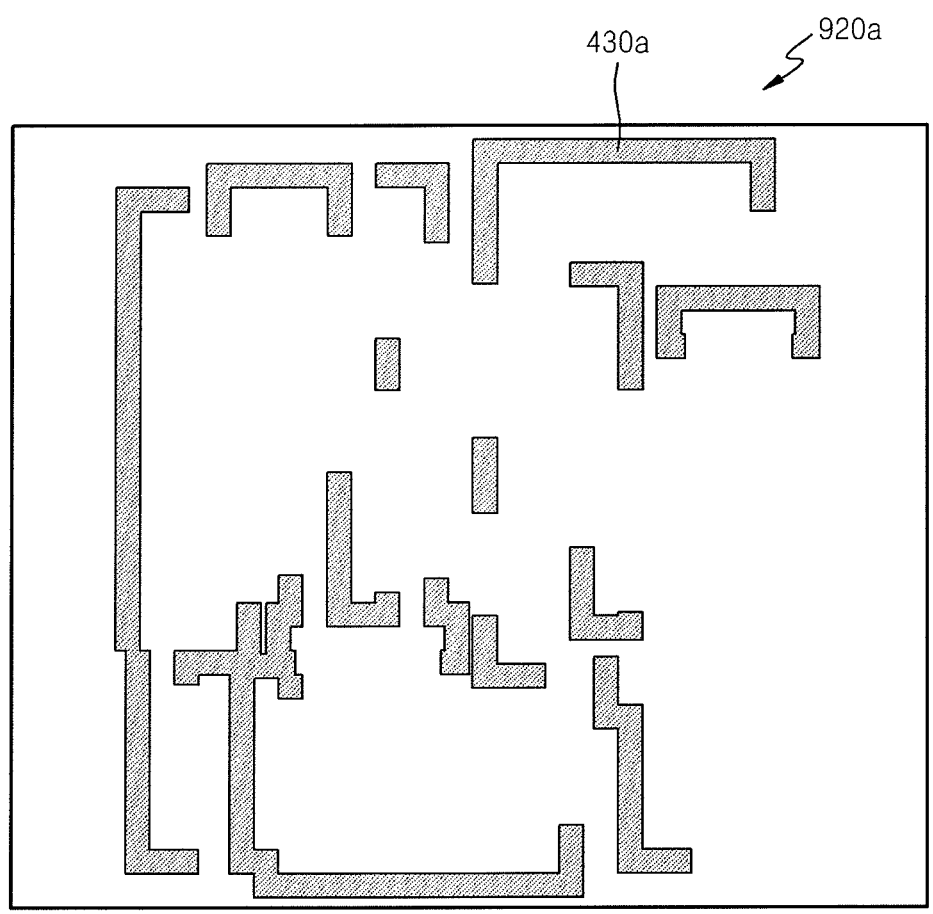
Figure 24:
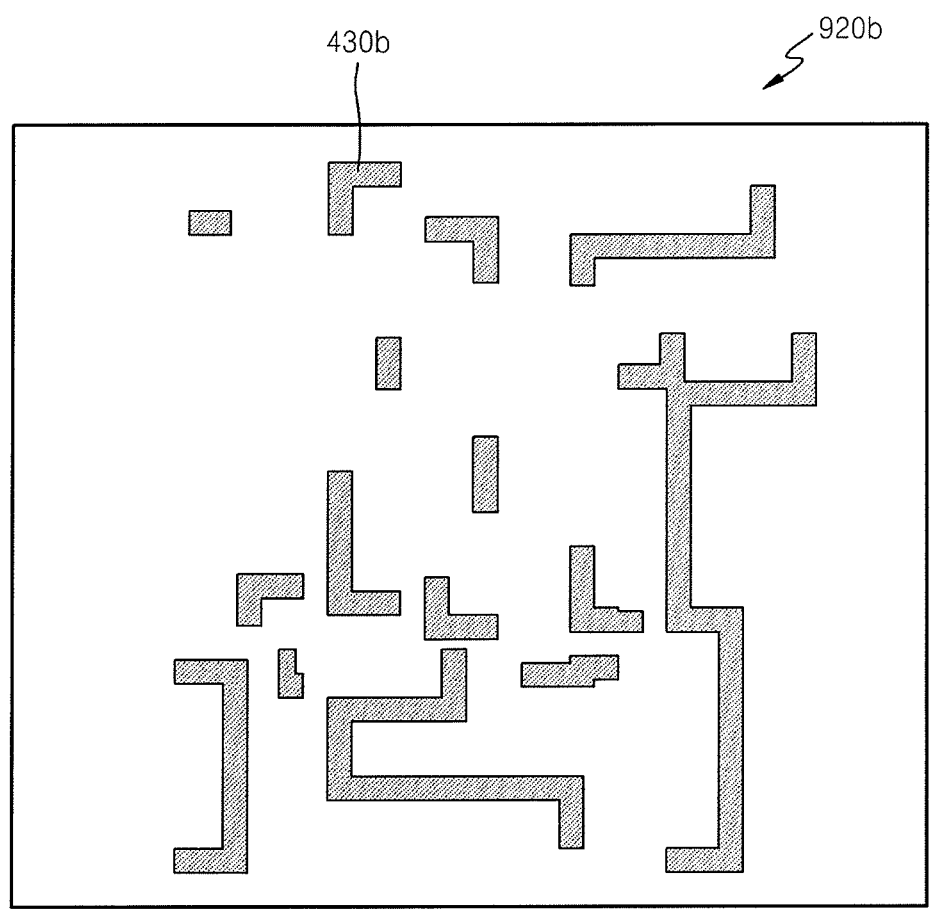
Figure 26:
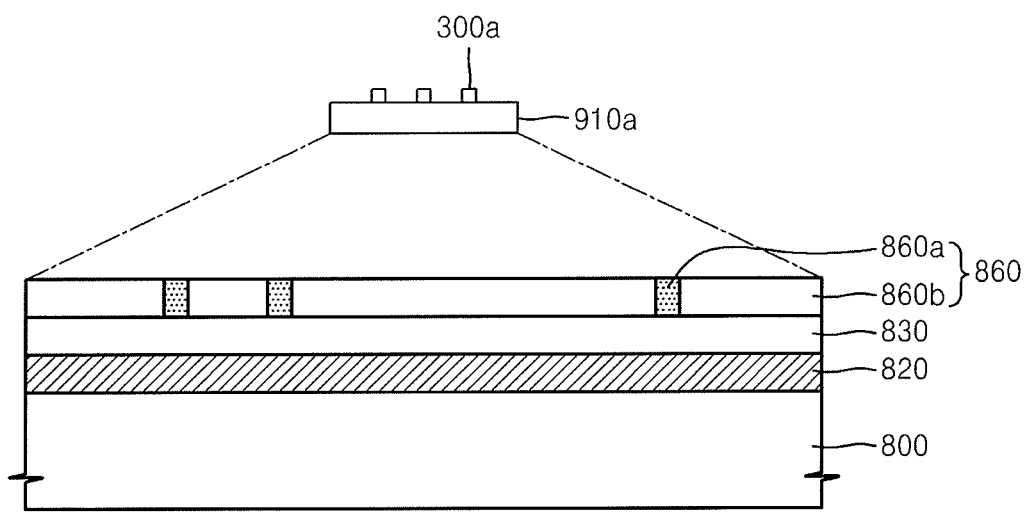
Figure 29:
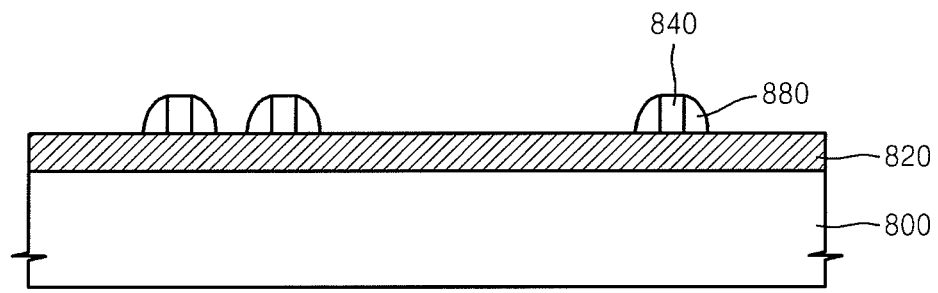
Figure 32:
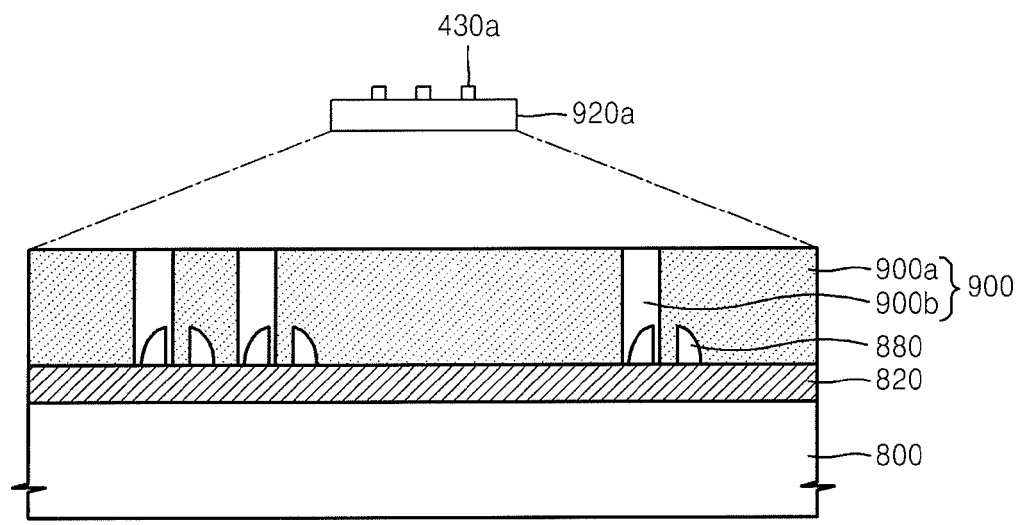
Figure 37:
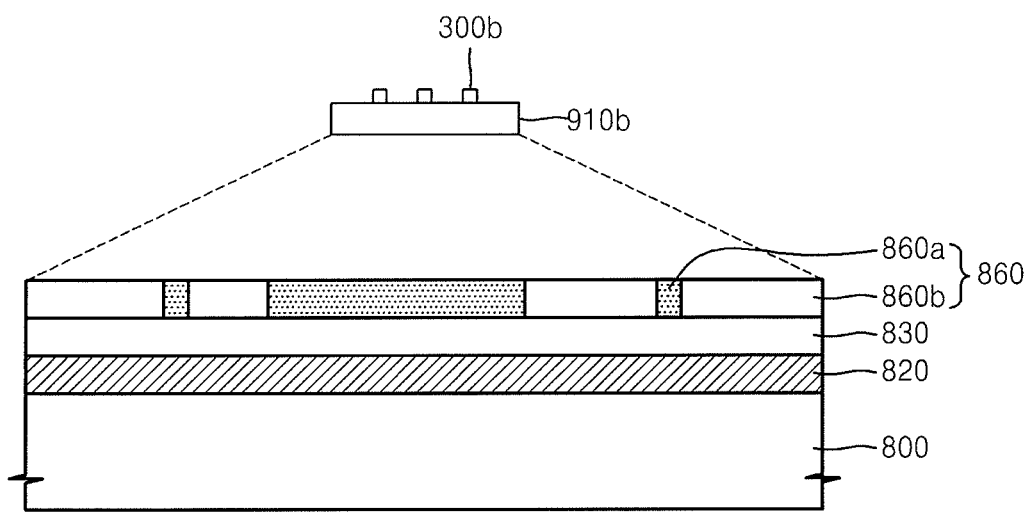
FIGS. 37 to 42 are diagrams illustrating a method of forming a pattern according to an exemplary embodiment of the inventive concept.
Figure 38:
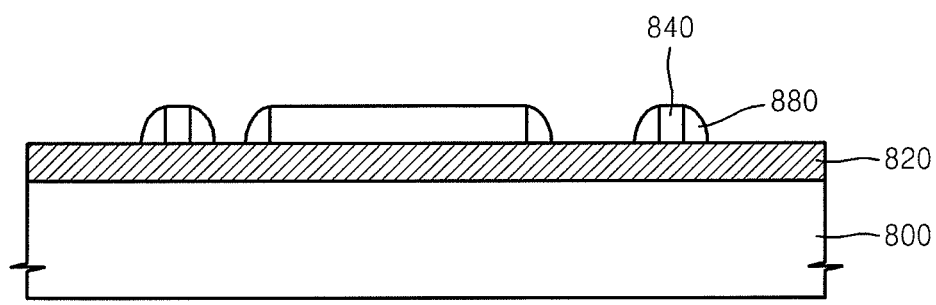
Figure 39:
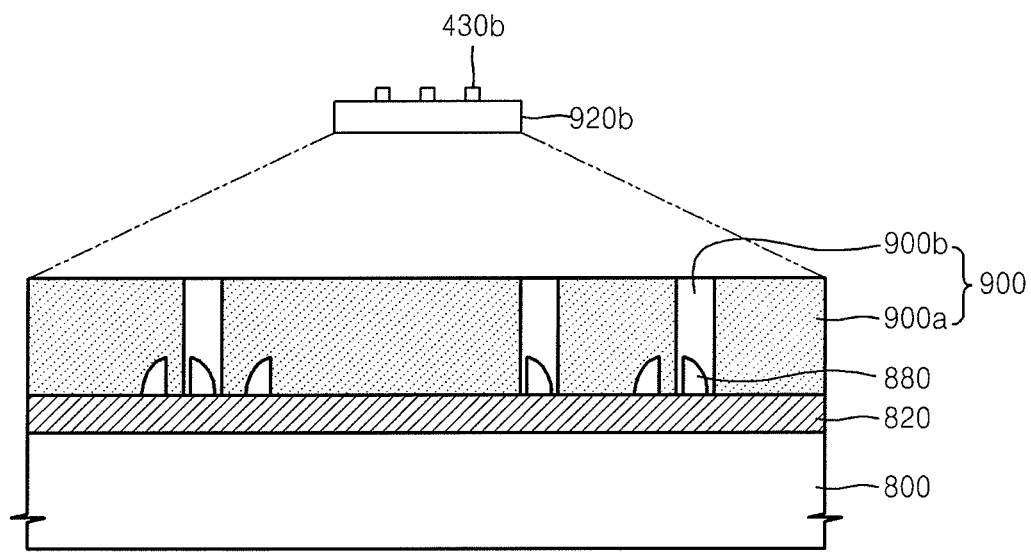

FIGS. 23 and 24 show the trimming patterns 430a and 430b. The trimming patterns 430a and 430b may be formed on the second reticle 920a (as shown in FIG. 32) and 920b (as shown in FIG. 39) used during the exposure process for double patterning the film to be etched 820 (as shown in FIG. 32), and may be used to remove a portion of the spacer 880 (as shown in FIG. 32) as an etch mask. FIG. 23 shows the trimming pattern 430a used to remove a portion of the spacer 880 (as shown in FIG. 29) that surrounds the sacrificial pattern 840 (as shown in FIG. 29) formed on the first reticle 910a (as shown in FIG. 26) including the initial pattern 300a (as shown in FIG. 26). FIG. 24 shows the trimming pattern 430b used to remove a portion of the spacer 880 (as shown in FIG. 38) that surrounds the sacrificial pattern 840 (as shown in FIG. 38) formed on the first reticle 910b (as shown in FIG. 37) including the initial pattern 300b (as shown in FIG. 18).

FIGS. 25 to 36 are diagrams illustrating a method of forming a pattern according to an exemplary embodiment of the inventive concept. The method of forming a pattern may include the steps shown in FIG. 13.

The method of forming a pattern according to the exemplary embodiment shown in FIGS. 25 to 36 may be used to form a pattern having the same shape as the target pattern 10a shown in FIG. 14. FIGS. 25 to 36 are cross-sectional views of a substrate taken along line A-A' of FIG. 14. The first reticle 910a (as shown in FIG. 26) including the initial pattern 300a (as shown in FIG. 17), and the second reticle 920a (as shown in FIG. 32) including the trimming pattern 430a (as shown in FIG. 23) may be used to form the pattern.

Figure 25:
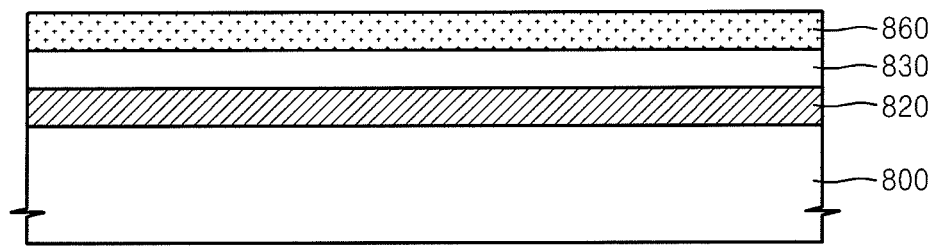
FIGS. 25 to 36 are diagrams illustrating a method of forming a pattern according to an exemplary embodiment of the inventive concept.

Referring to FIG. 25, the film to be etched 820, a mask layer 830, and a first photoresist layer 860 are sequentially formed on a substrate 800.

The substrate 800 may be any one of various semiconductor substrates, including, but not limited to, a silicon substrate. The film to be etched 820 may be, for example, a conductive or insulating layer formed of a metal, semiconductor, or insulating material.

The mask layer 830 may include various materials according to the type of the film to be etched 820. For example, the mask layer 830 may be an amorphous carbon layer (ACL) or a carbon-containing layer, or the mask layer 830 may be formed of a silicon-containing material such as, for example, $SiO_2$, $Si_3N_4$, SiCN, or polysilicon. The mask layer 830 may be formed, for example, by spin coating or chemical vapor deposition (CVD).

The first photoresist layer 860 may include, for example, a polymer as a solid mask, a sensitizer that deforms the polymer by reacting with light during an exposure process, and a solvent.

Referring to FIG. 26, an exposure process is performed using the first reticle 910a including the initial pattern 300a. For example, if the initial pattern 300a is formed of a material that blocks light, such as chromium (Cr), the first photoresist layer 860 may be a negative photoresist layer. In this case, a portion 860b of the first photoresist layer 860 that does not correspond to the initial pattern 300a may be softened. However, as will be appreciated by one of ordinary skill in the art, the inventive concept is not limited thereto, and a positive photoresist layer may be used to form a fine pattern.

Figure 27:
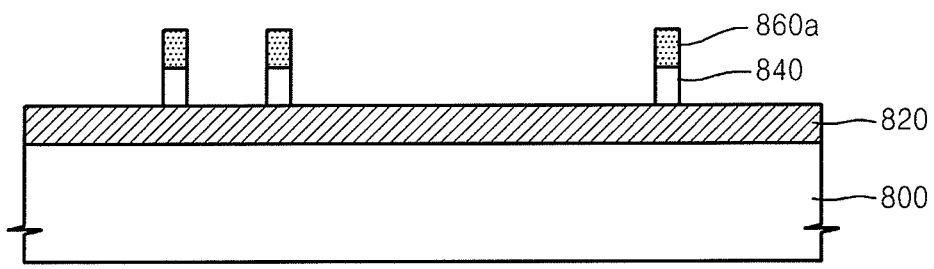

Referring to FIG. 27, the portion 860b of the first photoresist layer 860, which has been softened, is removed to form a photoresist pattern 860a corresponding to the initial pattern 300a, and the mask layer 830 is etched using the photoresist pattern 860a as an etch mask to form the sacrificial pattern 840.

Figure 28:
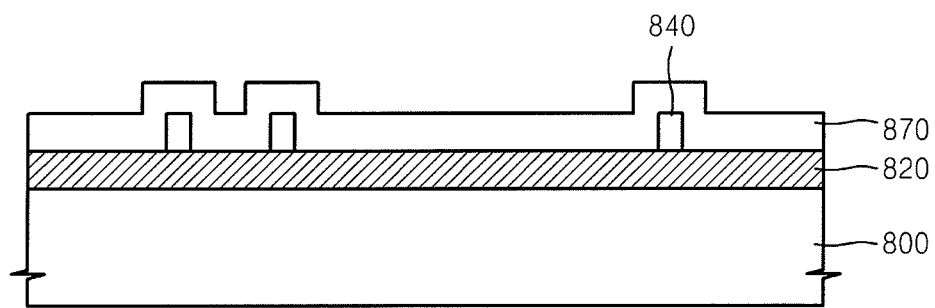

Referring to FIG. 28, a spacer layer 870 is formed on the sacrificial pattern 840. The spacer layer 870 may be formed of a material having an etch selectivity different from that of the film to be etched 820 and the sacrificial pattern 840. A thickness of the spacer layer 870 may correspond to a width of a desired fine pattern such as, for example, the width W of the target pattern 10a. The spacer layer 870 may have a uniform thickness by using, for example, atomic layer deposition (ALD).

Referring to FIG. 29, the spacer layer 870 is etched until an upper surface of the sacrificial pattern 840 and an upper surface of the film to be etched 820 are exposed to form the spacer 880 around sides of the sacrificial pattern 840. The spacer 880 may serve as an etch mask having a high pattern density.

Referring to FIG. 30, the sacrificial pattern 840 is removed. The sacrificial pattern 840 may be removed using, for example, ashing and stripping processes applied to the upper surface of the sacrificial pattern 840 exposed by the spacer 880. When the sacrificial pattern 840 is removed, the film to be etched 820 is further exposed by a space between adjacent spacers 880.

Figure 31:
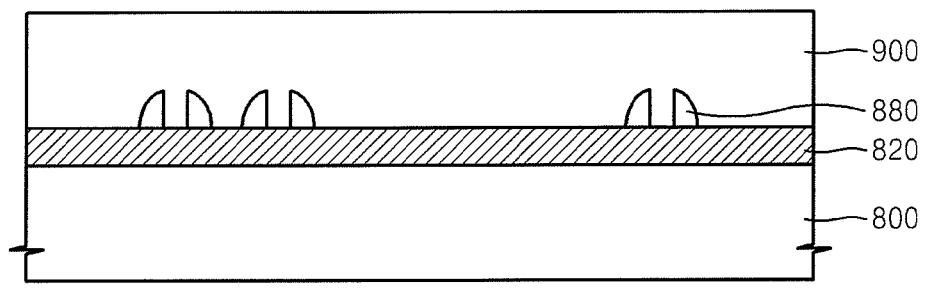

Referring to FIG. 31, a second photoresist layer 900 is formed on the spacer 880. The second photoresist layer 900 may include, for example, a polymer as a solid mask, a sensitizer that deforms the polymer by reacting with light during an exposure process, and a solvent.

Referring to FIG. 32, an exposure process is performed using the second reticle 920a including the trimming pattern 430a. For example, if the trimming pattern 430a is formed of a material that blocks light, such as chromium (Cr), the second photoresist layer 900 may be a positive photoresist layer. In this case, a portion 900a of the second photoresist layer 900 that does not correspond to the trimming pattern 430a may be hardened.

Figure 33:
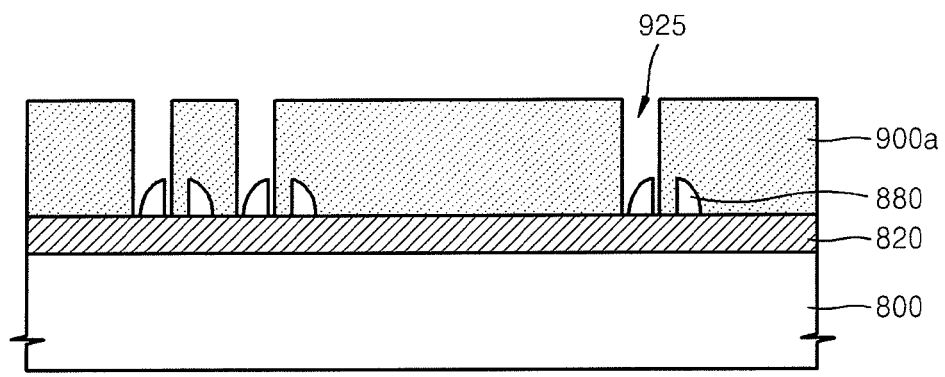
Figure 34:
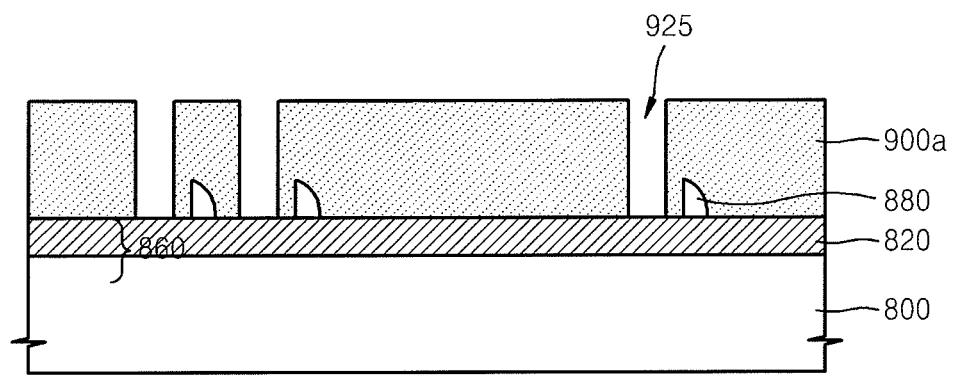

Referring to FIG. 33, an opening 925 that exposes a portion of the film to be etched 820 is formed by removing a portion 900b (as shown in FIG. 32) of the second photoresist layer 900 that is not hardened. Referring to FIG. 34, the portion 900a of the second photoresist layer 900 that remains is used as an etch mask to remove a portion of the spacer 880 exposed by the opening 925.

Figure 35:
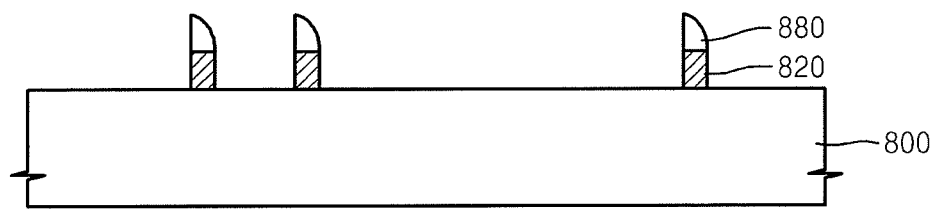
Figure 36:
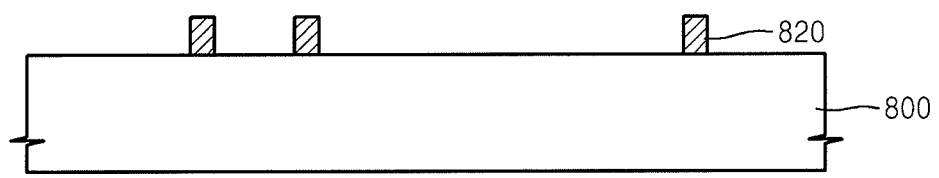

Referring to FIG. 35, the hardened portion 900a of the second photoresist layer 900 is removed, and the film to be etched 820 is etched using the spacer 880 as an etch mask. Referring to FIG. 36, the spacer 880 formed on the film to be etched 820 is removed. According to the method of forming a pattern described with reference to FIGS. 25 to 36, a fine pattern of the film to be etched 820 having the same shape as the target pattern 10*a* (as shown in FIG. 14) may be formed on the substrate 800.

FIGS. 37 to 42 are diagrams illustrating a method of forming a pattern according to an exemplary embodiment of the inventive concept. The method of forming a pattern according to the exemplary embodiment shown in FIGS. 37 to 42 may be similar to the method of forming a pattern shown in FIGS. 25 to 36.

The method of forming a pattern according to the exemplary embodiment shown in FIGS. 37-42 may be used to form a pattern having the same shape as the target pattern 10*a* (as shown in FIG. 14) on a substrate, and is similar to the method of forming a pattern described with reference to FIGS. 25 to 36. FIGS. 37 to 42 are cross-sectional views of a substrate taken along line A-A' of FIG. 14. In addition, the first reticle 910*b* (as shown in FIG. 37) including the initial pattern 300*b* (as shown in FIG. 18) and the second reticle 920*b* (as shown in FIG. 39) including the trimming pattern 430*b* (as shown in FIG. 24) may be used in the method of forming a pattern according to the exemplary embodiment shown in FIGS. 37-42.

Referring to FIG. 37, the film to be etched 820, the mask layer 830, and the first photoresist layer 860 are sequentially formed on the substrate 800, and an exposure process is performed using the first reticle 910*b* including the initial pattern 300*b*. For example, if the initial pattern 300*b* is formed of a material that blocks light, such as chromium (Cr), the first photoresist layer 860 may be a negative photoresist layer. In this case, the portion 860*b* of the first photoresist layer 860 which does not correspond to the initial pattern 300*a* may be softened.

Referring to FIG. 38, the portion 860*b* of the first photoresist layer 860 which has been softened is removed to form the photoresist pattern 860*a* corresponding to the initial pattern 300*b*, and the mask layer 830 is etched using the photoresist pattern 860*a* as an etch mask to form the sacrificial pattern 840. The spacer 880, which surrounds the sides of the sacrificial pattern 840, is then formed.

Referring to FIG. 39, the sacrificial pattern 840 is removed, and the second photoresist layer 900 is formed on the spacer 880. The exposure process is then performed using the second reticle 920*b* including the trimming pattern 430*b*. For example, if the trimming pattern 430*b* is formed of a material that blocks light, such as chromium (Cr), the second photoresist layer 900 may be a positive photoresist layer. In this case, the portion 900*a* of the second photoresist layer 900 which does not correspond to the trimming pattern 430*b* may be hardened.

Figure 40:
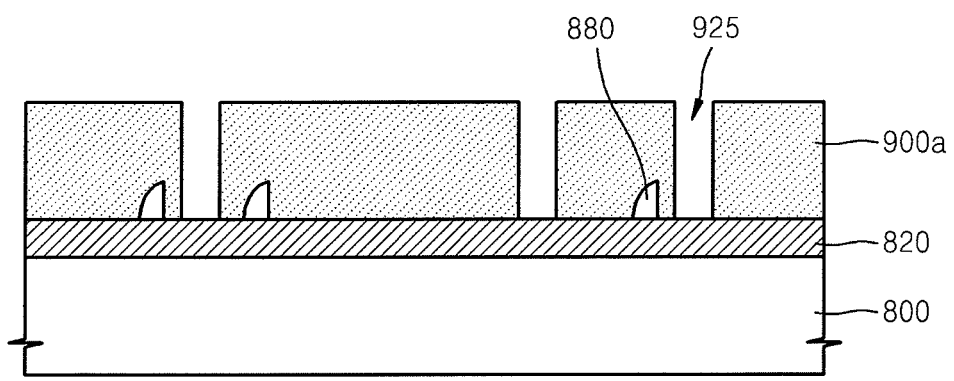

Referring to FIG. 40, the portion 900*b* of the second photoresist layer 900 which is not hardened is removed to form the opening 925, which exposes a portion of the film to be etched 820. The portion 900*a* of the second photoresist layer 900 which remains is used as an etch mask to remove a portion of the spacer 880 exposed by the opening 925.

Figure 41:
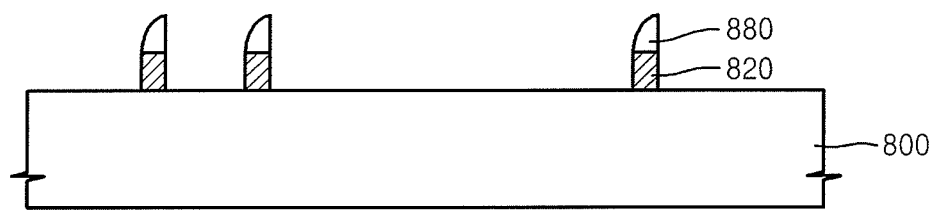
Figure 42:
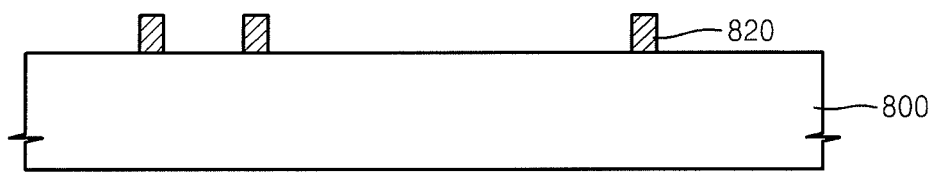

Referring to FIG. 41, the hardened portion 900*a* of the second photoresist layer 900 is removed, and the film to be etched 820 is etched using the spacer 880 as an etch mask. Referring to FIG. 42, the spacer 880 formed on the film to be etched 820 is removed to form a fine pattern on the film to be etched 820.

Figure 43:
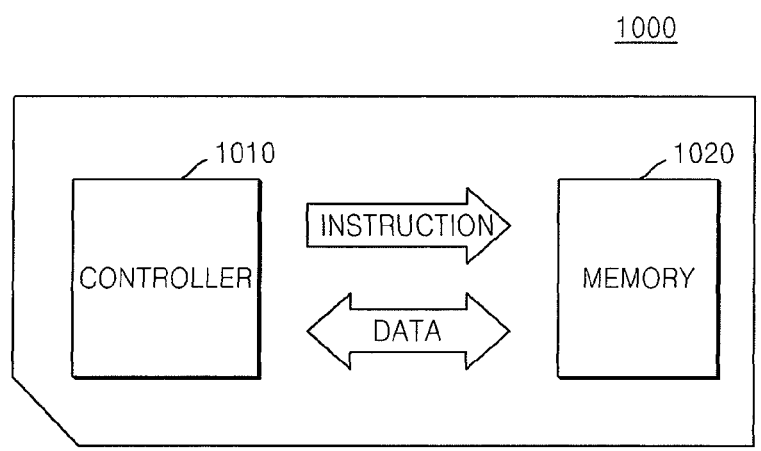
FIG. 43 is a schematic block diagram illustrating a card including a semiconductor device formed using a method of forming a pattern according to an exemplary embodiment of the inventive concept.

FIG. 43 is a schematic block diagram illustrating a card 1000 including a semiconductor device formed using a method of forming a pattern according to an exemplary embodiment of the inventive concept.

Referring to FIG. 43, a controller 1010 and a memory 1020 may be arranged to exchange an electrical signal. For example, when the controller 1010 provides an instruction, the memory 1020 may transmit data. The memory 1020 may include a semiconductor device fabricated according to one of the methods of fabricating a semiconductor device according to the exemplary embodiments of the inventive concept described above. The semiconductor device may be arranged, for example, as a "NAND" and "NOR" architecture memory array in correspondence to the design of a corresponding logic. Memory arrays arranged in a plurality of columns and rows may form one or more memory array banks. The memory 1020 may include such a memory array or a memory array bank. In addition, the card 1000 may further include a general column decoder, a row decoder, an input/output (I/O) buffer, and/or a control register in order to drive the memory array bank. The card 1000 may be embodied in any of various types of card-type memory devices, such as, for example, a memory stick card, a smart media (SM) card, a secure digital (SD) card, a mini secure digital (mini SD) card, or a multi media card (MMC).

Figure 44:
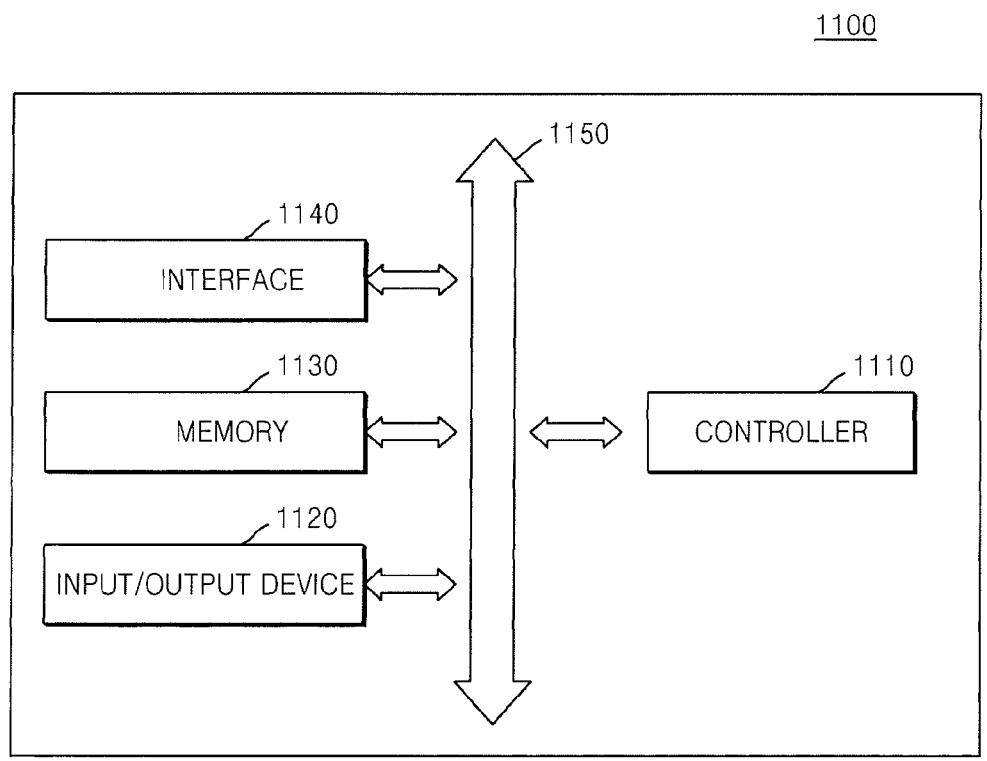
FIG. 44 is a schematic block diagram illustrating a system including a semiconductor device formed using a method of forming a pattern according to an exemplary embodiment of the inventive concept.

FIG. 44 is a schematic block diagram illustrating a system 1100 including a semiconductor device formed using a method of forming a pattern according to an exemplary embodiment of the inventive concept.

Referring to FIG. 44, the system 1100 may include a controller 1110, an input/output device 1120, a memory 1130, and an interface 1140. The system 1100 may be, for example, a mobile system or a system for transmitting and/or receiving data. For example, the mobile system may be a personal digital assistant (PDA), a portable computer, a web tablet, a wireless phone, a mobile phone, a digital music player, or a memory card. The controller 1110 may launch programs and control the system 1100. The controller 1110 may be, for example, a microprocessor, a digital signal processor, or a microcontroller. The input/output device 1120 may be used to input or output data to or from the system 1100. The system 1100 may be connected to an external device, such as, for example, a personal computer or a network, via the input/output device 1120, in order to exchange data with the external device. The input/output device 1120 may be, for example, a keypad, a keyboard, or a display. The memory 1130 may store code and data for operating the controller 1110 and/or may store data processed by the controller 1110. The memory 1130 may include a semiconductor device fabricated using a method of fabricating a semiconductor device according to the exemplary embodiments of the inventive concept. The interface 1140 may be a data transmission path between the system 1100 and an external device. The controller 1110, the input/output device 1120, the memory 1130, and the interface 1140 may communicate with each other via a bus 1150. For example, the system 1100 may be used in a mobile phone, an MP3 player, a navigation device, a portable multimedia player (PMP), a solid state disk (SSD), or a household appliance.

While the inventive concept has been particularly shown and described with reference to the exemplary embodiments thereof, it will be understood by those of ordinary skill in the art that various changes in form and detail may be made therein without departing from the spirit and scope of the inventive concept as defined by the following claims.

What is claimed is:

1. A method of forming a pattern, comprising:
forming a plurality of target patterns;
forming a plurality of pitch violating patterns, separate from the plurality of target patterns, that make contact with each of adjacent target patterns from among the plurality of target patterns, are disposed between the plurality of target patterns, and are spaced apart from one another;
classifying the plurality of pitch violating patterns into a first region and a second region adjacent to the first region;
fabricating an integrated circuit having an initial pattern corresponding to one of the first region and the second region;
forming a side wall that surrounds the initial pattern, wherein the side wall includes a first portion that overlaps the plurality of target patterns and a second portion that does not overlap the plurality of target patterns; and
forming a trimming pattern corresponding to the second portion of the side wall.

2. The method of claim 1, wherein each of the plurality of pitch violating patterns has a pitch less than a minimum pitch of an exposure apparatus.

3. The method of claim 2, further comprising:
associating the plurality of pitch violating patterns with a plurality of virtual nodes in a pattern-forming program stored on a computer readable medium;
establishing connectivity between virtual nodes among the plurality of virtual nodes in the pattern-forming program that correspond to pitch violating patterns among the plurality of pitch violating patterns that are separated by an interval that is less than the minimum pitch of the exposure apparatus;
assigning a first color and a second color to the plurality of virtual nodes in the pattern-forming program, alternately, based on the connectivity between the virtual nodes; and
classifying pitch violating patterns among the plurality of pitch violating patterns corresponding to the virtual nodes having the first color into the first region, and classifying pitch violating patterns among the plurality of pitch violating patterns corresponding to the virtual nodes having the second color into the second region.

4. The method of claim 1, further comprising:
forming a protrusion in the initial pattern, wherein the protrusion extends into a portion of one of the plurality of target patterns that does not make contact with the first region and the second region.

5. The method of claim 4, wherein the protrusion protrudes from a portion of the one of the plurality of target patterns in a direction perpendicular to an extending direction of the one of the target patterns by a minimum bar size.

6. The method of claim 5, wherein the minimum bar size is between about ¼ of a minimum pitch of an exposure apparatus and about 3/2 of the minimum pitch of the exposure apparatus.

7. The method of claim 4, wherein the protrusion includes a first protrusion that protrudes in a first direction perpendicular to an extending direction of the one of the plurality of target patterns, a second protrusion that protrudes in a second direction perpendicular to the first protrusion, and a corner disposed between the first protrusion and the second protrusion.

8. The method of claim 1, further comprising:
forming a correction unit on the trimming pattern; and
increasing an overlay margin of the trimming pattern using the correction unit.

9. The method of claim 1, further comprising:
forming the initial pattern on a first reticle of an exposure apparatus; and
forming the trimming pattern on a second reticle of the exposure apparatus.

10. The method of claim 9, further comprising:
forming a sacrificial pattern on a film using the first reticle;
forming a spacer that surrounds the sacrificial pattern;
removing the sacrificial pattern;
partially removing the spacer using the second reticle; and
etching the film using the spacer as an etch mask.

11. A method of forming a pattern, comprising:
forming a plurality of target patterns, wherein each of the plurality of target patterns has a pitch less than a minimum pitch of an exposure apparatus;
forming a boundary region that surrounds the plurality of target patterns;
forming a plurality of pitch violating patterns that have a width less than the minimum pitch of the exposure apparatus, and are disposed between each of the plurality of target patterns and between the plurality of target patterns and the boundary region;
classifying the plurality of pitch violating patterns into a first region and a second region adjacent to the first region;
fabricating an integrated circuit having an initial pattern corresponding to one of the first region and the second region;
forming a side wall that surrounds the initial pattern, wherein the side wall includes a first portion that overlaps the plurality of target patterns and a second portion that does not overlap the plurality of target patterns; and
forming a trimming pattern corresponding to the second portion of the side wall.

12. The method of claim 11, further comprising:
expanding each of the plurality of target patterns by a predetermined size; and
adding the expanded regions together to form the boundary region.

13. The method of claim 12, wherein the predetermined size is equal to a difference between a width of each of the plurality of target patterns and the minimum pitch of the exposure apparatus.

14. The method of claim 11, further comprising:
forming a dummy pattern adjacent to a pitch violating pattern among the plurality of pitch violating patterns that makes contact with the boundary region.

15. The method of claim 14, further comprising:
removing a portion of the dummy pattern that does not make contact with the initial pattern.

16. A method of forming a pattern, comprising:
forming a plurality of target patterns;
forming a plurality of pitch violating patterns that make contact with the plurality of target patterns and are disposed between the plurality of target patterns;
classifying the plurality of pitch violating patterns into a first region and a second region adjacent to the first region;
fabricating an integrated circuit having an initial pattern corresponding to one of the first region and the second region;
forming a side wall that surrounds the initial pattern, wherein the side wall includes a first portion that overlaps the plurality of target patterns and a second portion that does not overlap the plurality of target patterns; and forming a trimming pattern corresponding to the second portion of the side wall.

17. The method of claim 16, further comprising:
forming a correction unit on the trimming pattern; and
increasing an overlay margin of the trimming pattern using the correction unit.

18. The method of claim 16, further comprising:
forming the initial pattern on a first reticle of an exposure apparatus; and
forming the trimming pattern on a second reticle of the exposure apparatus.

19. The method of claim 18, further comprising:
forming a sacrificial pattern on a film using the first reticle;
forming a spacer that surrounds the sacrificial pattern;
removing the sacrificial pattern;
partially removing the spacer using the second reticle; and
etching the film using the spacer as an etch mask.

20. The method of claim 16 wherein each of the plurality of pitch violating patterns has a pitch less than a minimum pitch of an exposure apparatus.

21. The method of claim 20, further comprising:
associating the plurality of pitch violating patterns with a plurality of virtual nodes in a pattern-forming program stored on a computer readable medium;
establishing connectivity between virtual nodes among the plurality of virtual nodes in the pattern-forming program that correspond to pitch violating patterns among the plurality of pitch violating patterns that are separated by an interval that is less than the minimum pitch of the exposure apparatus;
assigning a first color and a second color to the plurality of virtual nodes in the pattern-forming program, alternately, based on the connectivity between the virtual nodes; and
classifying pitch violating patterns among the plurality of pitch violating patterns corresponding to the virtual nodes having the first color into the first region, and classifying pitch violating patterns among the plurality of pitch violating patterns corresponding to the virtual nodes having the second color into the second region.

22. The method of claim 16, further comprising:
forming a protrusion in the initial pattern, wherein the protrusion extends into a portion of one of the plurality of target patterns that does not make contact with the first region and the second region.

23. The method of claim 22, wherein the protrusion protrudes from a portion of the one of the plurality of target patterns in a direction perpendicular to an extending direction of the one of the target patterns by a minimum bar size.

24. The method of claim 23, wherein the minimum bar size is between about ¼ of a minimum pitch of an exposure apparatus and about 3/2 of the minimum pitch of the exposure apparatus.

25. The method of claim 22, wherein the protrusion includes a first protrusion that protrudes in a first direction perpendicular to an extending direction of the one of the plurality of target patterns, a second protrusion that protrudes in a second direction perpendicular to the first protrusion, and a corner disposed between the first protrusion and the second protrusion.

* * * * *